(12) United States Patent
Nishi et al.

(10) Patent No.: US 6,677,101 B2
(45) Date of Patent: Jan. 13, 2004

(54) POLYMERS, RESIST MATERIALS, AND PATTERN FORMATION METHOD

(75) Inventors: Tsunehiro Nishi, Niigata-ken (JP); Koji Hasegawa, Niigata-ken (JP); Mutsuo Nakashima, Niigata-ken (JP)

(73) Assignee: Shin-Etsu Chemical Co., Ltd. (JP)

( * ) Notice: Subject to any disclaimer, the term of this patent is extended or adjusted under 35 U.S.C. 154(b) by 150 days.

(21) Appl. No.: 10/050,478

(22) Filed: Jan. 16, 2002

(65) Prior Publication Data

US 2002/0132182 A1 Sep. 19, 2002

(30) Foreign Application Priority Data

Jan. 17, 2001 (JP) .................................. 2001-008613

(51) Int. Cl.$^7$ ............................................. G03F 7/039
(52) U.S. Cl. .................... 430/270.1; 430/330; 430/296; 430/326; 430/327; 526/256
(58) Field of Search ............................. 430/270.1, 330, 430/296, 326, 327; 526/256

(56) References Cited

U.S. PATENT DOCUMENTS

| | | | |
|---|---|---|---|
| 6,200,731 B1 * | 3/2001 | Lee et al. ................. | 430/270.1 |
| 6,509,481 B2 * | 1/2003 | Kinsho et al. ............. | 549/331 |
| 6,512,067 B2 * | 1/2003 | Nishi et al. ............... | 526/266 |
| 6,538,086 B1 * | 3/2003 | Chang et al. .............. | 526/271 |
| 2002/0042531 A1 * | 4/2002 | Sumino ...................... | 556/437 |
| 2002/0132970 A1 * | 9/2002 | Watanabe et al. .......... | 528/425 |
| 2002/0147290 A1 * | 10/2002 | Nakashima et al. ........ | 526/266 |
| 2002/0150835 A1 * | 10/2002 | Nishi et al. ............... | 430/270.1 |
| 2003/0008232 A1 * | 1/2003 | Kinsho et al. ............. | 430/270.1 |
| 2003/0045731 A1 * | 3/2003 | Nakashima et al. ........ | 549/444 |

* cited by examiner

*Primary Examiner*—Janet Baxter
*Assistant Examiner*—Yvette C. Thornton
(74) *Attorney, Agent, or Firm*—Myers, Bigel, Sibley & Sajovec, P.A.

(57) ABSTRACT

An object of the present invention is to provide a polymer which has excellent reactivity, rigidity and adhesion to the substrate, and undergoes a low degree of swelling during development, a resist material which uses this polymer as the base resin and hence exhibits much higher resolving power and etching resistance than conventional resist materials, and a pattern formation method using this resist material. Specifically, the present invention provides a novel polymer containing repeating units represented by the following general formula (1-1) or (1-2) and having a weight-average molecular weight of 1,000 to 500,000, a resist material using the polymer as a base resin, and a pattern formation method using the resist material.

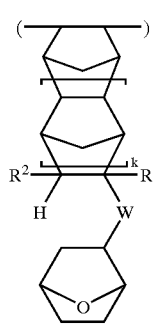

(1-1)

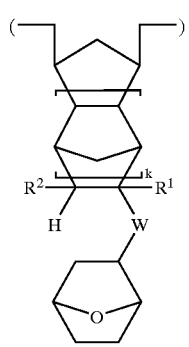

(1-2)

20 Claims, No Drawings

POLYMERS, RESIST MATERIALS, AND PATTERN FORMATION METHOD

CROSS-REFERENCE TO RELATED APPLICATIONS

The present application claims priority to Japanese Patent Application No. 2001-008613, filed Jan. 17, 2001, the disclosure of which is incorporated herein by reference in its entirety.

BACKGROUND OF THE INVENTION

1. Field of the Invention

This invention relates to (1) polymers containing specific repeating units, (2) resist materials containing such polymers as base resins, and (3) a pattern formation method using such a resist materials.

2. Description of the Related Art

In recent years, increasingly finer pattern rules are required as the degree of integration and speed of LSIs become higher. Under these circumstances, far ultraviolet lithography is regarded as a promising fine processing technique of the next generation. In particular, photolithography using KrF or ArF excimer laser light as the light source is considered to be a technique indispensable for ultrafine processing to a size of 0.3 µm or less, and its realization is eagerly desired.

In resist materials for use with a KrF excimer laser, polyhydroxystyrene having a practicable level of transparency and etching resistance has become an actual standard base resin. In resist materials for use with a ArF excimer laser, several materials such as derivatives of polyacrylic acid or polymethacrylic acid and polymers containing an alicyclic compound in the main chain are being investigated. However, both of them have merits and demerits. In the present situation, therefore, no standard base resin has been established as yet.

Specifically, resist materials using a derivative of polyacrylic acid or polymethacrylic acid have advantages such as high reactivity of acid-decomposable groups and excellent adhesion to the substrate, and produce relatively good results with respect to sensitivity and resolving power. However, since the main chain of the resin is soft and weak, these resist materials have very low etching resistance and are hence unsuitable for practical use. On the other hand, resist materials using a polymer containing an alicyclic compound in the main chain have a practicable level of etching resistance owing to the sufficiently rigid main chain of the resin. However, since the reactivity of acid-decomposable groups is much poorer as compared with (meth)acrylic type resist materials, their sensitivity and resolving power are low. Moreover, their adhesion to the substrate is low owing to the excessively rigid main chain of the resin. Consequently, these resist materials are also unsuitable for practical use. As used herein, the term "(meth) acrylic type" means methacrylic type or acrylic type.

A problem common to both the (meth)acrylic type and the alicyclic main chain type is the disintegration of patterns due to swelling of the resist film. In these types of resist materials, their resolving power has been enhanced by increasing the difference between dissolution rates before and after exposure. Consequently, they have come to reach a very high level of hydrophobicity. Highly hydrophobic resist materials can hold the film strongly in unexposed regions and allow the film to be instantaneously dissolved in overexposed regions. However, in the considerably wide exposure range therebetween, they permit infiltration of the developer but fail to dissolve, and hence swell. Actually, for very minute pattern sizes requiring the use of an ArF excimer laser, it is impossible to use a resist material which causes adjacent patterns to be united together or disintegrated as a result of swelling. In the present situation where increasingly finer pattern rules are required, there is a need for a resist material which not only exhibits excellent properties such as sensitivity, resolving power and etching resistance, but also undergoes a well-controlled degree of swelling.

SUMMARY OF THE INVENTION

The present invention has been made in view of the above-described circumstances, and an object of the present invention is to provide (1) a polymer which has excellent reactivity, rigidity and adhesion to the substrate, and undergoes a low degree of swelling during development, (2) a resist material which uses this polymer as the base resin and hence exhibits much higher resolving power and etching resistance than conventional resist materials, and (3) a pattern formation method using this resist material.

The present inventors carried out intensive investigations with a view to accomplishing the above object. As a result, it has now been found that a novel polymer containing repeating units represented by the following general formula (1-1) or (1-2) and having a weight-average molecular weight of 1,000 to 500,000, which can be prepared according to a process as will be described later, has excellent reactivity, rigidity and adhesion to the substrate, exhibits suitably high solubility in developers, and undergoes a low degree of swelling, that a resist material using this polymer as the base resin has high resolving power and high etching resistance, and that this resist material is very useful for accurate and fine processing.

Thus, the present invention provides a polymer containing repeating units represented by the following general formula (1-1) or (1-2) and having a weight-average molecular weight of 1,000 to 500,000.

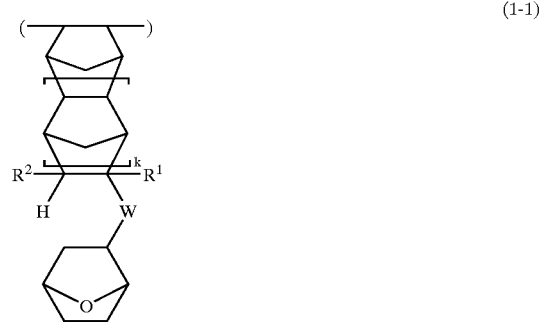

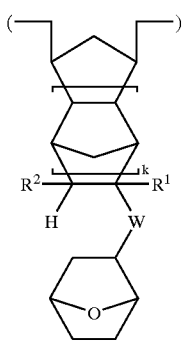

(1-2)

wherein R¹ represents a hydrogen atom, a methyl group or CH₂CO₂R³; R² represents a hydrogen atom, a methyl group or CO₂R³; R³ represents a straight-chain, branched or cyclic alkyl group having 1 to 15 carbon atoms, and may be common to R¹ and R² or different therebetween; W represents a straight-chain or branched divalent hydrocarbon radical having 2 to 10 carbon atoms, which may have one or more ester linkages in its structure and may further be substituted by one or more other atomic groups containing a heteroatom; and k is 0 or 1.

Moreover, the present invention also provides a resist material containing a polymer as described above, as well as a pattern formation method comprising the steps of applying the resist material to a substrate; after a heat treatment, exposing the resist material to high-energy radiation or electron rays through a photomask; and, after an optional heat treatment, developing the resist material with a developer.

Polymers containing repeating units represented by the general formula (1-1) or (1-2) have bridged alicyclic rings in the main chain and hence exhibit high rigidity. Moreover, since they have a very highly polar 7-oxabicyclo[2.2.1]heptane ring in the side chain, they also exhibit excellent adhesion to the substrate and a good affinity for developers which is directly associated with a reduction of swelling. Furthermore, since a spacer having a suitable length is introduced between the 7-oxabicyclo[2.2.1]heptane ring and the rigid main chain, the rigidity which has been excessively high in the prior art is moderately relaxed. In addition, the 7-oxabicyclo[2.2.1]heptane ring moiety is located at a position remote from the main chain, and can hence function more effectively as a polar group. Consequently, these compounds have much better adhesion to the substrate than conventional compounds. Furthermore, the low reactivity which has been a big problem in the prior art is improved by the introduction of a spacer and the ensuing enhanced diffusibility of the acid produced, and a reduction in line edge roughness is achieved at the same time. Accordingly, resist materials using these polymers as base resins have excellent properties from the viewpoint of sensitivity, resolving power and etching resistance, and undergo a well-controlled degree of swelling during development, so that they are very useful for the formation of fine patterns.

Since resist materials using the polymers of the present invention as base resins are sensitive to high-energy radiation and have excellent sensitivity, resolving power and etching resistance, they are useful for fine processing with electron rays or far ultraviolet radiation. In particular, since they exhibit low absorption at the exposure wavelengths of ArF and KrF excimer lasers, they are characterized in that fine patterns perpendicular to the substrate can be easily formed.

DETAILED DESCRIPTION OF THE PREFERRED EMBODIMENTS

The present invention will be more specifically described hereinbelow.

The novel polymers of the present invention are characterized by containing repeating units represented by the general formula (1-1) or (1-2) and having a weight-average molecular-weight of 1,000 to 500,000.

In the above general formulas, R¹ represents a hydrogen atom, a methyl group or CH₂CO₂R³. Specific examples of R³ will be given below. R² represents a hydrogen atom, a methyl -group or CO₂R³. R³ represents a straight-chain, branched or cyclic alkyl group having 1 to 15 carbon atoms, and may be common to R¹ and R² or different therebetween. Specific examples thereof include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl. k is 0 or 1.

W represents a straight-chain or branched divalent hydrocarbon radical having 2 to 10 carbon atoms, which may have one or more ester linkages in its structure and may further be substituted by one or more other atomic groups containing a heteroatom. Although W can represent a large variety of groups, some specific examples are given below.

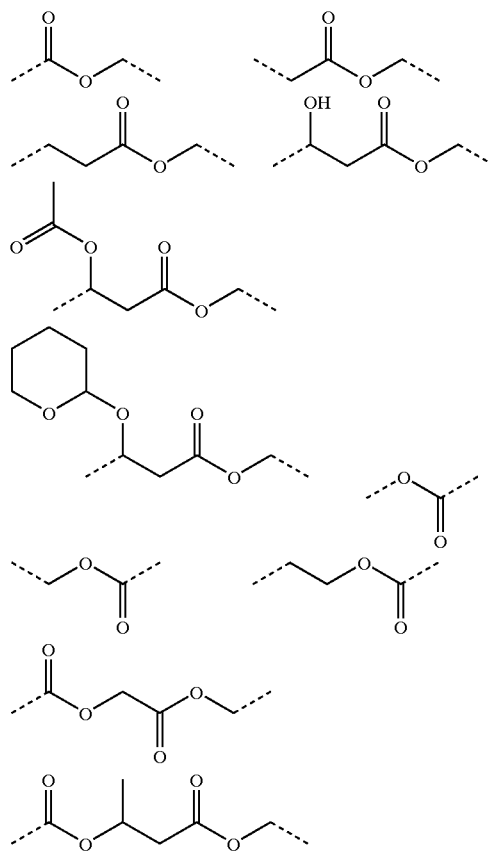

wherein the broken lines represent chemical bonds.

The polymers of the present invention may preferably comprise the following four types of polymers.

(1) Polymers which, in addition to the repeating units represented by the general formula (1-1), contain repeating units represented by the following general formula (2-1).

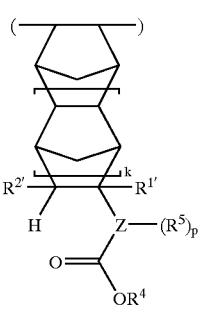

(2-1)

wherein k is as defined above; $R^{1'}$ represents a hydrogen atom, a methyl group or $CH_2CO_2R^3$; $R^{2'}$ represents a hydrogen atom, a methyl group or $CO_2R^{3'}$; $R^{3'}$ represents a straight-chain, branched or cyclic alkyl group having 1 to 15 carbon atoms, and may be common to $R^1$ and $R^2$ or different therebetween; $R^4$ represents an acid-labile group; $R^5$ represents a halogen atom, a hydroxyl group, a straight-chain, branched or cyclic alkoxy, acyloxy or alkylsulfonyloxy group having 1 to 15 carbon atoms, or a straight-chain, branched or cyclic alkoxyalkoxy or alkoxycarbonyloxy group having 2 to 15 carbon atoms, in which some or all of the hydrogen atoms on the constituent carbon atoms may be replaced by halogen atoms; Z represents a single bond or a straight-chain, branched or cyclic (p+2)-valent hydrocarbon radical having 1 to 5 carbon atoms, and when Z is a hydrocarbon radical, one or more methylene groups may be replaced by an oxygen atom to form a linear or cyclic ether, or two hydrogen atoms on an identical carbon atom may be replaced by an oxygen atom to form a ketone; and p is 0, 1 or 2.

(2) Polymers which, in addition to the repeating units represented by the general formula (1-1), contain repeating units represented by the following general formulas (2-1) and (3).

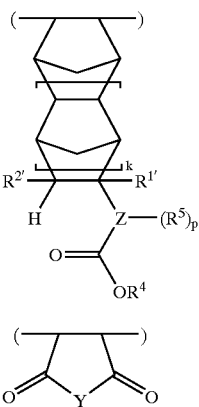

(2-1)

(3)

wherein k, p, $R^{1'}$, $R^{2'}$, $R^{3'}$, $R^4$ and $R^5$ are as defined above; Y represents —O— or —(NR$^6$)—; and $R^6$ represents a hydrogen atom or a straight-chain, branched or cyclic alkyl group having 1 to 15 carbon atoms.

(3) Polymers which, in addition to the repeating units represented by the general formula (1-1), contain repeating units represented by the following general formula (4), or both repeating units represented by the following general formula (4) and repeating units represented by the following general formula (2-1), and further contain repeating units represented by the following general formula (3).

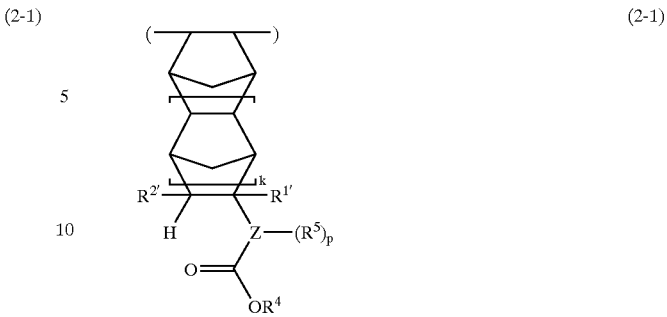

(2-1)

(3)

(4)

wherein k, p, $R^{1'}$, $R^{2'}$, $R^{3'}$, $R^4$, $R^5$ and Y are as defined above; $R^{1''}$ represents a hydrogen atom, a methyl group or $CH_2CO_2R^{3''}$; $R^{2''}$ represents a hydrogen atom, a methyl group or $CO_2R^{3''}$; $R^{3''}$ represents a straight-chain, branched or cyclic alkyl group having 1 to 15 carbon atoms, and may be common to $R^{1''}$ and $R^{2''}$ or different therebetween; and $R^{4'}$ represents an acid-labile group.

(4) Polymers which, in addition to the repeating units represented by the general formula (1-2), contain repeating units represented by the following general formula (2-2).

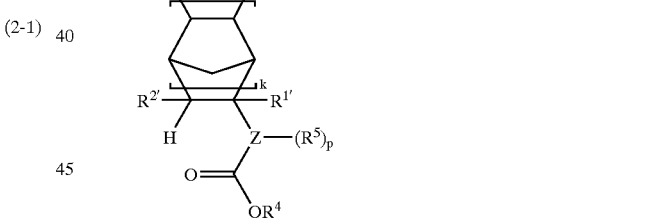

(2-2)

wherein k, p, $R^{1'}$, $R^{2'}$, $R^{3'}$, $R^4$ and $R^5$ are as defined above. $R^{1''}$ to $R^{3'}$ and $R^{1''}$ to $R^{3''}$ are as defined above for $R^1$ to $R^3$. $R^4$ and $R^{4'}$ each represents an acid-labile group, and specific examples thereof will be given later. $R^5$ represents a halogen atom, a hydroxyl group, a straight-chain, branched or cyclic alkoxy, acyloxy or alkylsulfonyloxy group having 1 to 15 carbon atoms, or a straight-chain, branched or cyclic alkoxyalkoxy or alkoxycarbonyloxy group having 2 to 15 carbon atoms, in which some or all of the hydrogen atoms on the constituent carbon atoms may be replaced by halogen atoms. Specific examples thereof include fluorine, chlorine, bromine, methoxy, ethoxy, propoxy, isopropoxy, n-butoxy, sec-butoxy, tert-butoxy, tert-amyloxy, n-pentoxy, n-hexyloxy, cyclopentyloxy, cyclohexyloxy, ethylcyclopentyloxy, butylcyclopentyloxy, ethylcyclohexyloxy, butylcyclohexyloxy, adamantyloxy, ethyladamantyloxy, butyladamantyloxy, formyloxy, acetoxy, ethylcarbonyloxy, pivaloyloxy, methanesulfonyloxy, ethanesulfonyloxy, n-butanesulfonyloxy, trifluoroacetoxy, trichloroacetoxy, 2,2, 2-trifluoroethylcarbonyloxy, methoxymethoxy, 1-ethoxyethoxy, 1-ethoxypropoxy, 1-tert-butoxyethoxy, 1-cyclohexyloxyethoxy, 2-tetrahydrofuranyloxy, 2-tetrahydropyranyloxy, methoxycarbonyloxy, ethoxycarbonyloxy and tert-butoxycarbonyloxy. Y represents —O— or —(NR$^6$)—, and R$^6$ represents a hydrogen atom or a straight-chain, branched or cyclic alkyl group having 1 to 15 carbon atoms. Specific examples of R$^6$ are the same groups as enumerated for R$^3$. Z represents a single bond or a straight-chain, branched or cyclic (p+2)-valent hydrocarbon radical having 1 to 5 carbon atoms, and when Z is a hydrocarbon radical, one or more methylene groups may be replaced by an oxygen atom to form a linear or cyclic ether, or two hydrogen atoms on an identical carbon atom may be replaced by an oxygen atom to form a ketone. When p is 0, specific examples of Z include methylene, ethylene, trimethylene, tetramethylene, pentamethylene, hexamethylene, 1,2-propanediyl, 1,3-butanediyl, 1-oxo-2-oxapropane-1,3-diyl and 3-methyl-1-oxo-2-4 oxabutane-1,4-diyl. When p is other than 0, specific examples of Z include (p+2)-valent groups formed by removing p hydrogen atoms from the above-enumerated groups.

Although various acid-labile groups may be used for R$^4$ and R$^{4'}$, specific examples thereof include groups represented by the following general formulas (L1) to (L4), tertiary alkyl groups having 4 to 20 carbon atoms and preferably 4 to 15 carbon atoms, trialkylsilyl groups in which each alkyl group has 1 to 6 carbon atoms, and oxoalkyl groups having 4 to 20 carbon atoms.

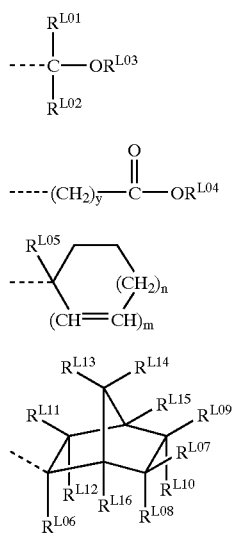

In these formulas, the broken lines represent chemical bonds (hereinafter the same). R$^{L01}$ and R$^{L02}$ each represent a hydrogen atom or a straight-chain, branched or cyclic alkyl group having 1 to 18 carbon atoms and preferably 1 to 10 carbon atoms. Specific examples thereof include methyl, ethyl, propyl, isopropyl, n-butyl, sec-butyl, tert-butyl, cyclopentyl, cyclohexyl, 2-ethylhexyl and n-octyl. R$^{L03}$ represents a univalent hydrocarbon radical having 1 to 18 carbon atoms and preferably 1 to 10 carbon atoms and optionally containing one or more heteroatoms such as oxygen atoms, and includes straight-chain, branched or cyclic alkyl groups and such alkyl groups in which some of the hydrogen atoms are replaced by hydroxyl, alkoxy, oxo, amino, alkylamino or like groups. Specific examples thereof are the following substituted alkyl groups.

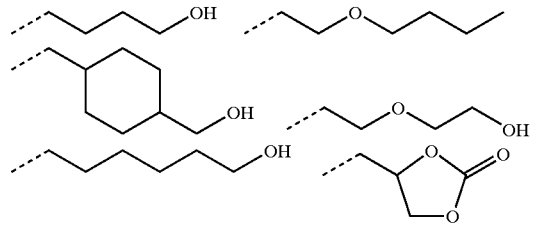

R$^{L01}$ and R$^{L02}$ R$^{L01}$ and R$^{L03}$, or R$^{L02}$ and R$^{L03}$ may form a ring. When they form a ring, R$^{L01}$, R$^{L02}$ and R$^{L03}$ each represent a straight-chain or branched alkylene group having 1 to 18 carbon atoms and preferably 1 to 10 carbon atoms.

R$^{L04}$ represents a tertiary alkyl group having 4 to 20 carbon atoms and preferably 4 to 15 carbon atoms, a trialkylsilyl group in which each alkyl group has 1 to 6 carbon atoms, an oxoalkyl group having 4 to 20 carbon atoms, or a group represented by the above general formula (L1). Specific examples of the tertiary alkyl group include tert-butyl, tert-amyl, 1,1-diethylpropyl, 2-cyclopentylprop-2-yl, 2-cyclohexylprop-2-yl, 2-(bicyclo[2.2.1]hept-2-yl) prop-2-yl, 2-(adamant-1-yl)prop-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl and 2-ethyl-2-adamantyl. Specific examples of the trialkylsilyl group include trimethylsilyl, triethylsilyl and dimethyl-tert-butylsilyl. Specific examples of the oxoalkyl group include 3-oxocyclohexyl, 4-methyl-2-oxooxan-4-yl and 5-methyl-2-oxooxolan-5-yl. y is an integer of 0 to 6.

R$^{L05}$ represents a univalent hydrocarbon radical having 1 to 8 carbon atoms and optionally containing a heteroatom, or an optionally substituted aryl group having 6 to 20 carbon atoms. Specific examples of the univalent hydrocarbon radical optionally containing a heteroatom include straight-chain, branched or cyclic alkyl groups such as methyl, ethyl, propyl, isopropyl, n-butyl, sec-butyl, tert-butyl, tert-amyl, n-pentyl, n-hexyl, cyclopentyl and cyclohexyl; and such alkyl groups in which one or more of the hydrogen atoms are replaced by hydroxyl, alkoxy, carboxyl, alkoxycarbonyl, oxo, amino, alkylamino, cyano, mercapto, alkylthio, sulfo or like groups. Specific examples of the optionally substituted aryl group include phenyl, methylphenyl, naphthyl, anthryl, phenanthryl and pyrenyl. m is 0 or 1, and n is 0, 1, 2 or 3, and these numbers must satisfy the condition defined by 2m+n=2 or 3.

R$^{L06}$ represents a univalent hydrocarbon radical having 1 to 8 carbon atoms and optionally containing a heteroatom, or an optionally substituted aryl group having 6 to 20 carbon atoms. Specific examples of R$^{L06}$ are the same groups as enumerated for R$^{L05}$. R$^{L07}$ to R$^{L06}$ each independently represents a hydrogen atom or a univalent hydrocarbon radical having 1 to 15 carbon atoms and optionally containing a heteroatom. Specific examples of the hydrocarbon radical include straight-chain, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, and cyclohexylbutyl; and such alkyl groups in which one or more of the hydrogen atoms are replaced by hydroxyl, alkoxy, carboxyl, alkoxycarbonyl, oxo, amino, alkylamino, cyano, mercapto, alkylthio, sulfo or like groups. R$^{L07}$ to R$^{L16}$ (e.g., R$^{L07}$ and R$^{L08}$, R$^{L07}$ and R$^{L09}$, R$^{L08}$ R$^{L10}$, and R$^{L10}$, R$^{L09}$ and R$^{L10}$, $R^{L11}$ and $R^{L12}$ or $R^{L13}$ and $R^{L14}$) may be joined together to form a ring. In such a case, each of them represents a divalent hydrocarbon radical having 1 to 15 carbon atoms and optionally containing a heteroatom. Specific examples thereof are groups formed by removing one hydrogen atom from the above-enumerated univalent radicals. Alternatively, $R^{L07}$ to $R^{L116}$ (e.g., $R^{L07}$ and $R^{L09}$, $R^{L09}$ and $R^{L15}$, or $R^{L13}$ and $R^{L15}$) may be joined together in such a way that two groups attached to adjacent carbon atoms are directly connected to form a double bond.

Specific examples of the straight-chain or branched acid-labile groups represented by formula (L1) are as follows.

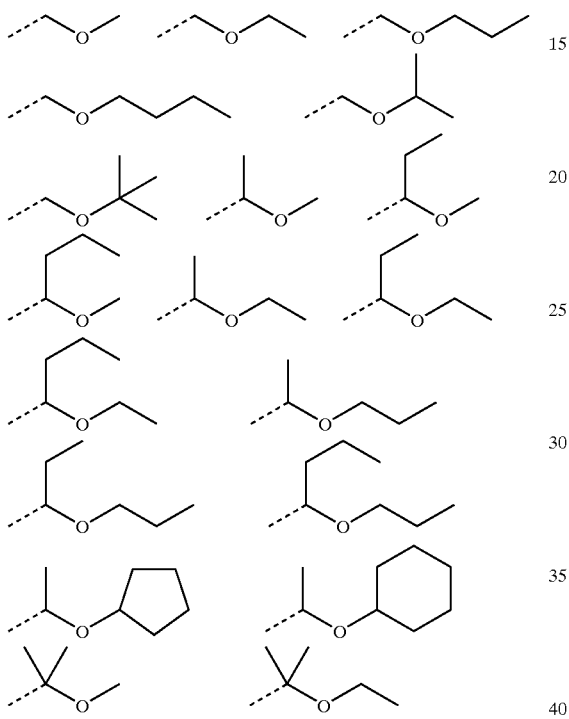

Specific examples of the cyclic acid-labile groups represented by formula (L1) include tetrahydrofuran-2-yl, 2-methyltetrahydrofuran-2-yl, tetrahydropyran-2-yl and 2-methyltetrahydropyran-2-yl.

Specific examples of the acid-labile groups represented by formula (L2) include tert-butoxycarbonyl, tert-butoxycarbonylmethyl, tert-amyloxycarbonyl, tert-amyloxycarbonyl-methyl, 1,1-diethylpropyloxycarbonyl, 1,1-diethylpropyloxy-carbonylmethyl, 1-ethylcyclopentyloxycarbonyl, 1-ethylcyclopentyloxycarbonylmethyl, 1-ethyl-2-cyclopentenyloxy-carbonyl, 1-ethyl-2-cyclopentenyloxycarbonylmethyl, 1-ethoxyethoxycarbonylmethyl, 2-tetrahydropyranyloxycarbonylmethyl and 2-tetrahydrofuranyloxycarbonylmethyl.

Specific examples of the acid-labile groups represented by formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methyl-cyclohexyl, 1-ethylcyclohexyl, 3-methyl-1-cyclopenten-3-yl, 3-ethyl-1-cyclopenten-3-yl, 3-methyl-1-cyclohexen-3-yl and 3-ethyl-1-cyclohexen-3-yl.

Specific examples of the acid-labile groups represented by formula (L4) are as follows.

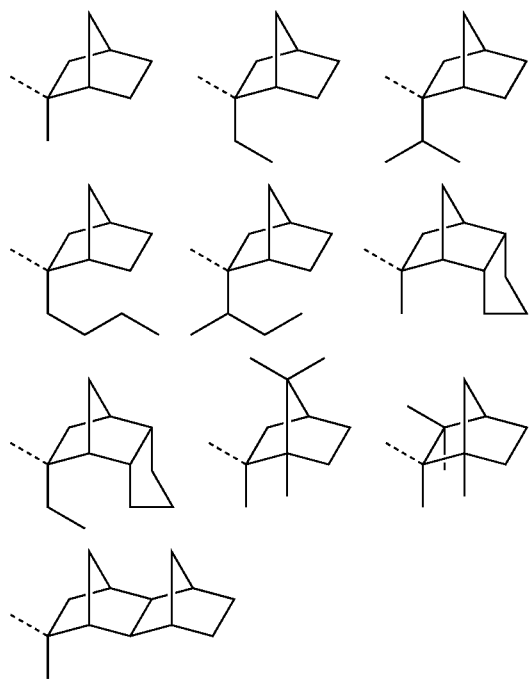

Specific examples of the tertiary alkyl groups having 4 to 20 carbon atoms, the trialkylsilyl groups in which each alkyl group has 1 to 6 carbon atoms, and the oxoalkyl groups having 4 to 20 carbon atoms are the same groups as enumerated for $R^{L04}$.

Specific examples of the repeating units represented by the general formula (1-1) are given below. However, it is to be understood that the present invention is not limited thereto.

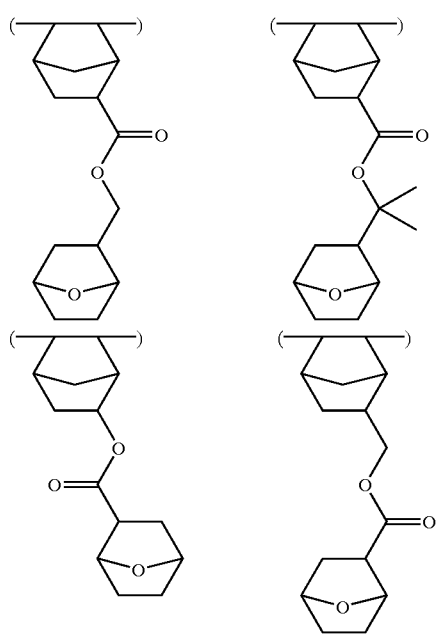

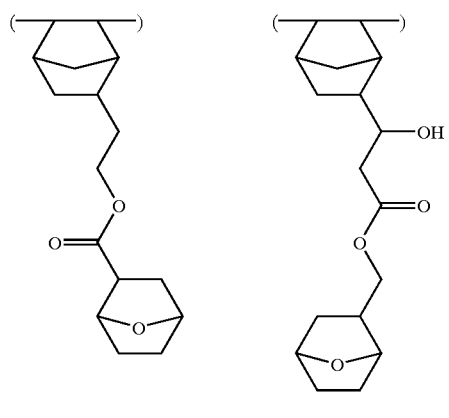
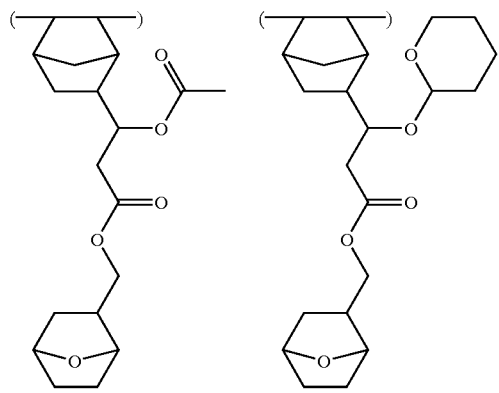
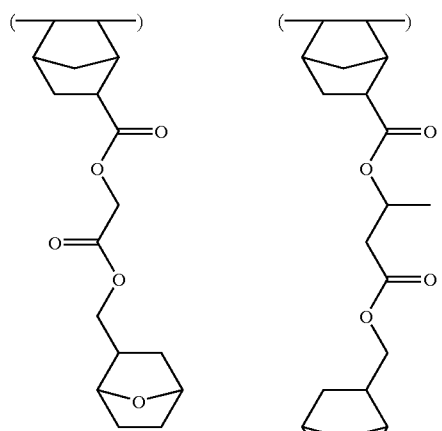
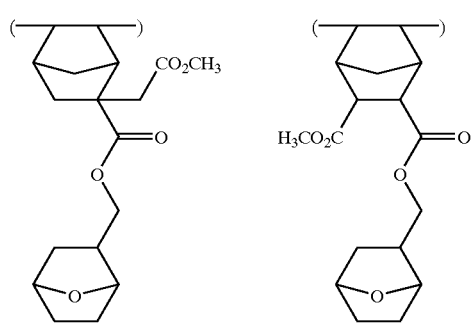
Specific examples of the repeating units represented by the general formula (1-2) are given below. However, it is to be understood that the present invention is not limited thereto.
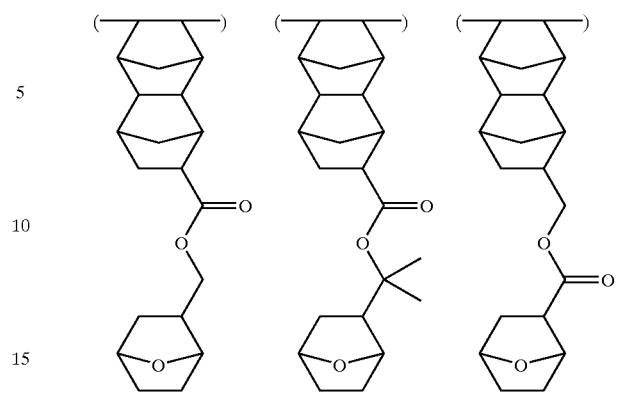
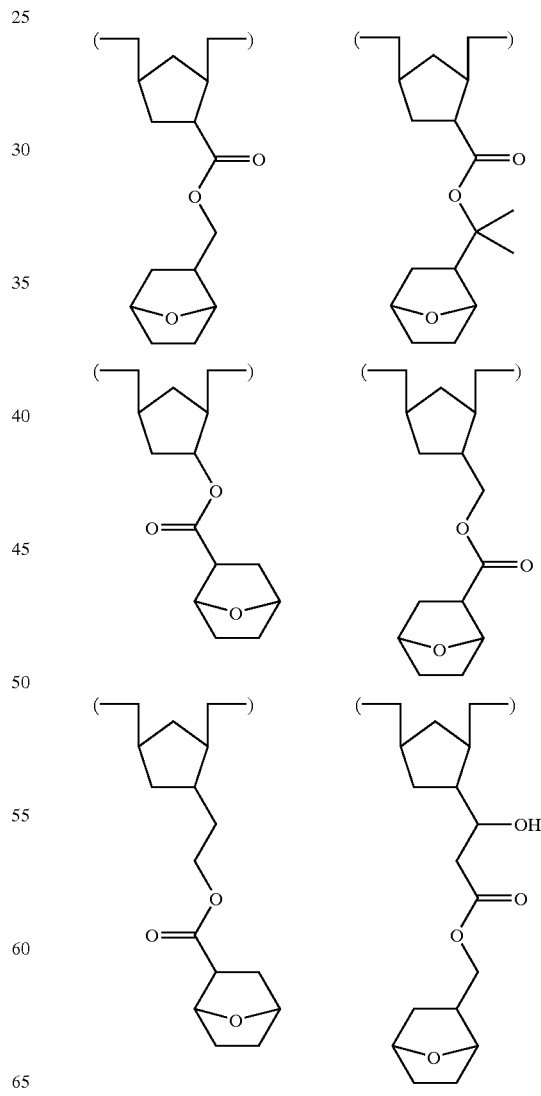

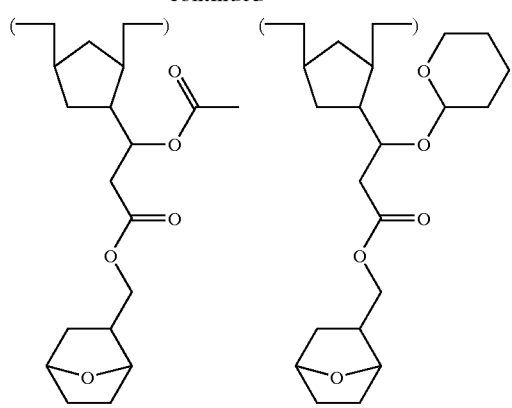
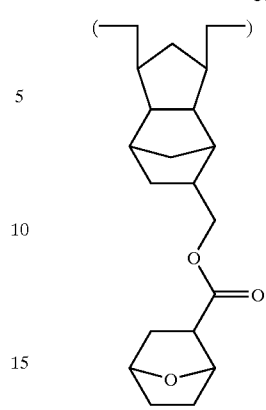
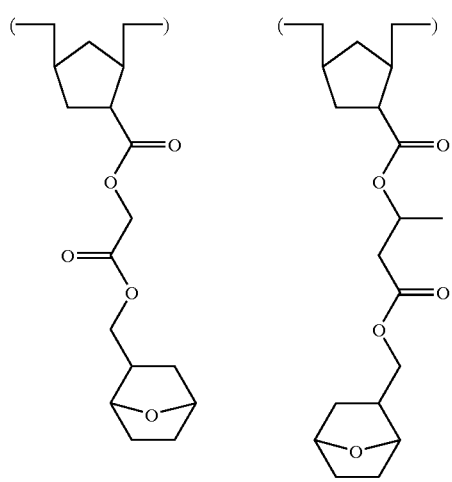
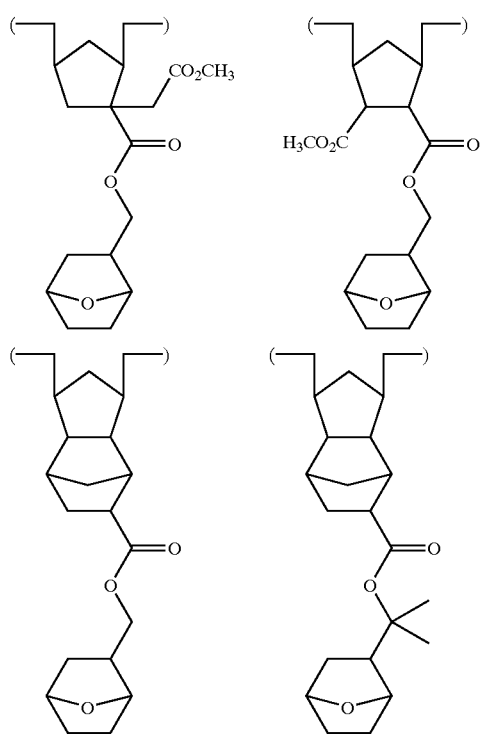
Specific examples of the repeating units represented by the general formula (2-1) are given below. However, it is to be understood that the present invention is not limited thereto.
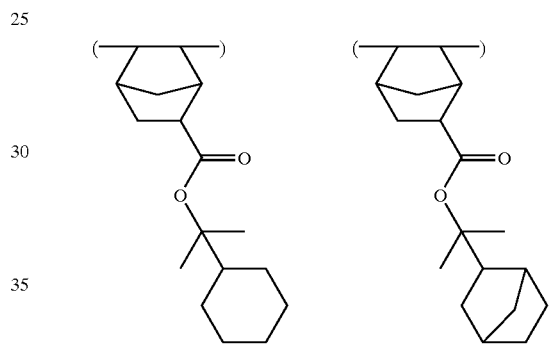
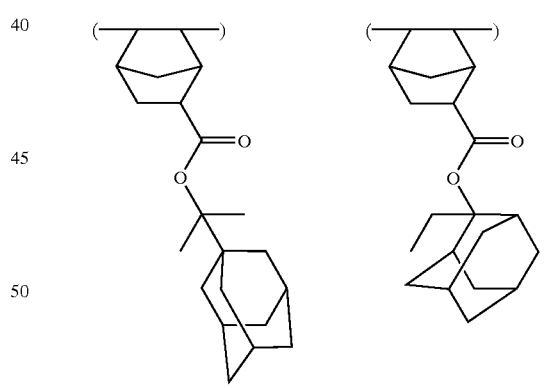
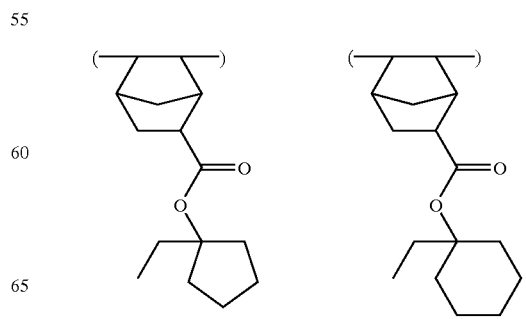

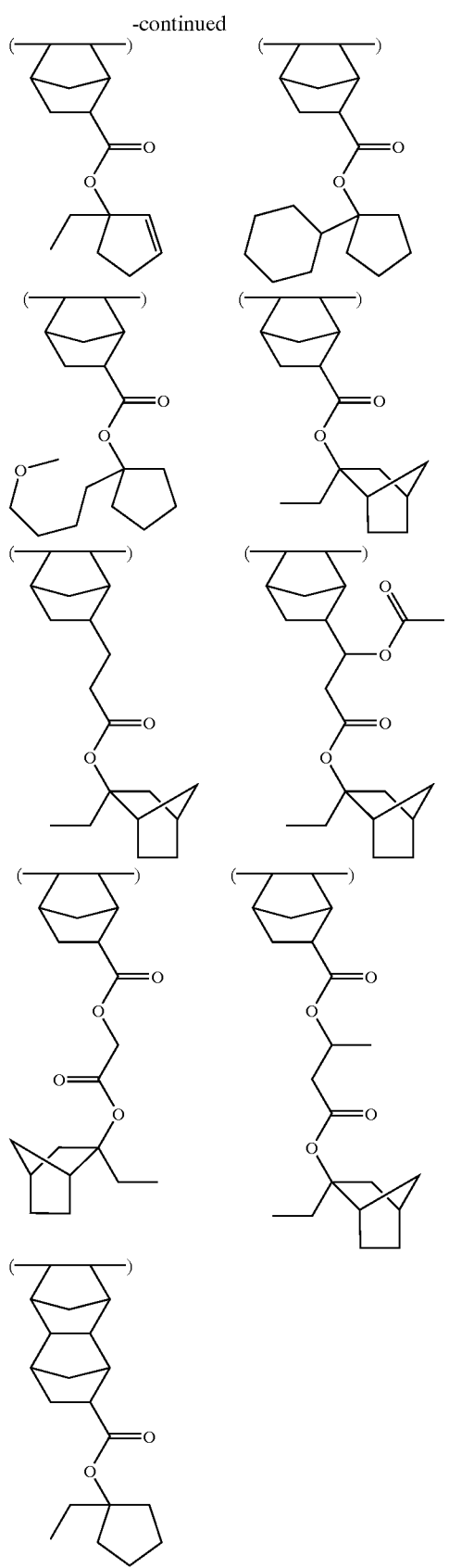
Specific examples of the repeating units represented by the general formula (2-2) are given below. However, it is to be understood that the present invention is not limited thereto.
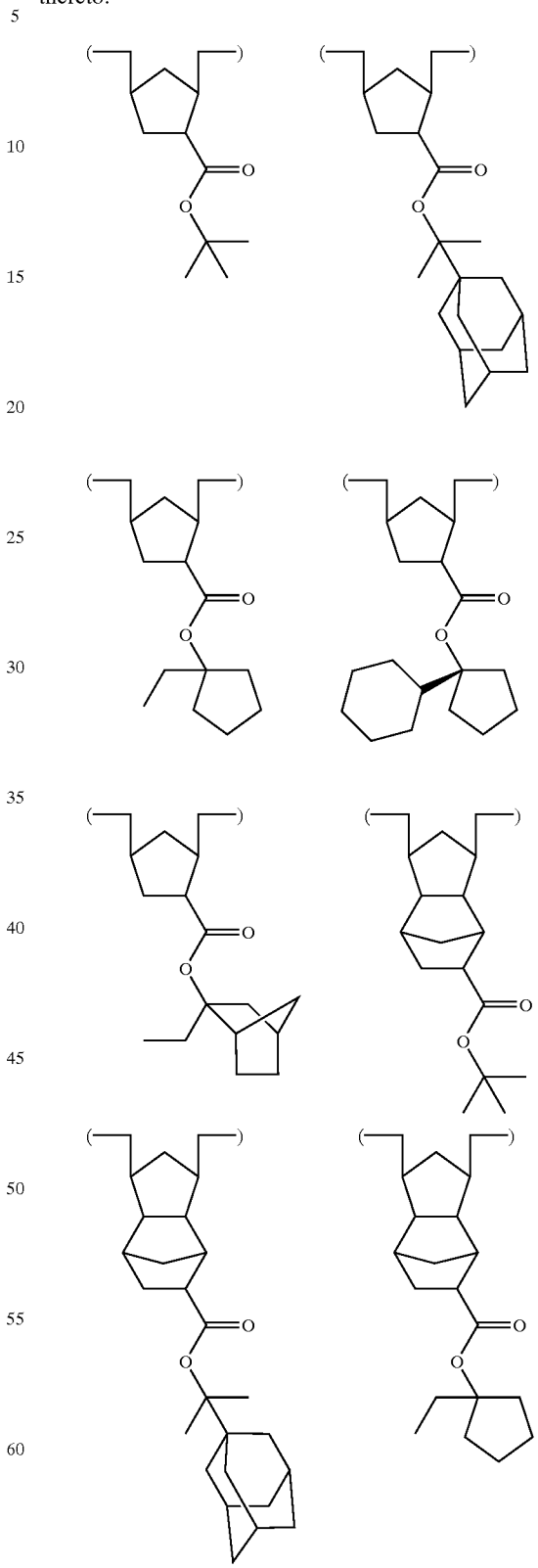

-continued

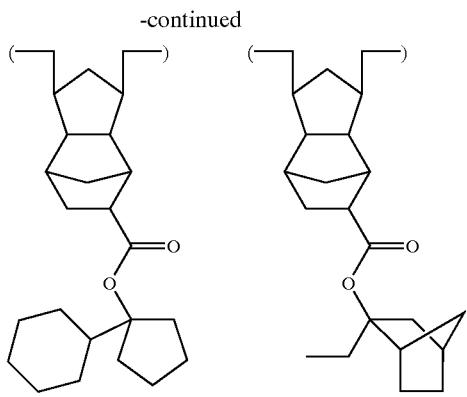
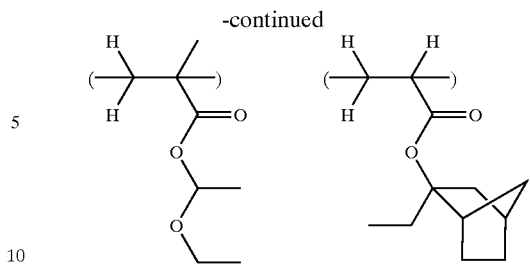

Specific examples of the repeating units represented by the general formula (4) are given below. However, it is to be understood that the present invention is not limited thereto.

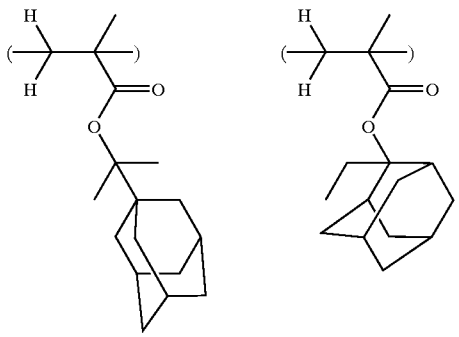
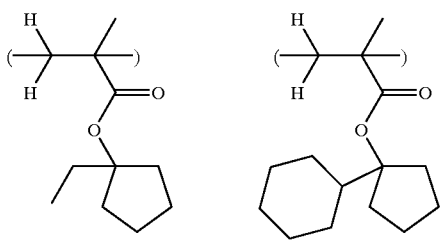
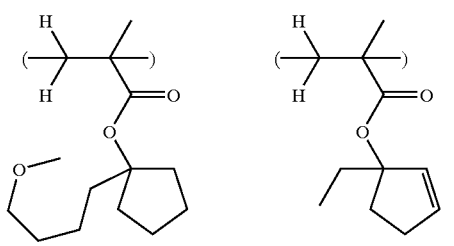
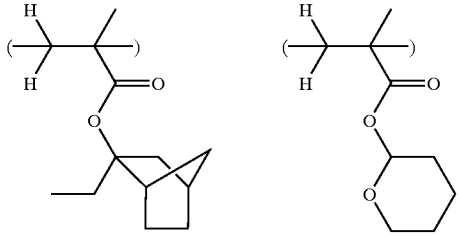

If necessary, the polymers of the present invention may further contain one or more types of repeating units selected from the repeating units represented by the following general formulas (M1) to (M8-2).

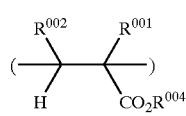

(M1)

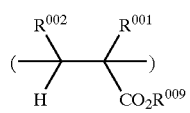

(M2)

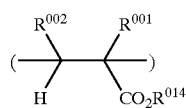

(M3)

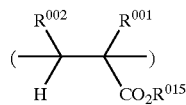

(M4)

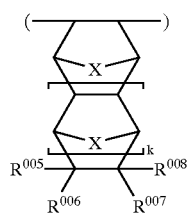

(M5-1)

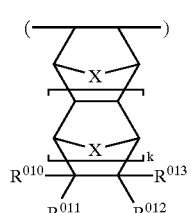

(M6-1)

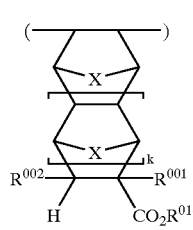

(M7-1)

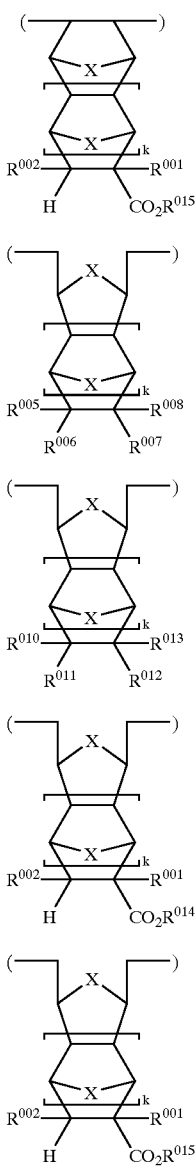

(M8-1)

(M5-2)

(M6-2)

(M7-2)

(M8-2)

In the above formulas, $R^{001}$ represents a hydrogen atom, a methyl group or $CH_2CO_2R^{003}$. $R^{002}$ represents a hydrogen atom, a methyl group or $CO_2R^{003}$. $R^{003}$ represents a straight-chain, branched or cyclic alkyl group having 1 to 15 carbon atoms. $R^{004}$ represents a hydrogen atom or a univalent hydrocarbon radical having 1 to 15 carbon atoms and containing a carboxyl or hydroxyl group. At least one of $R^{005}$ to $R^{008}$ represents a univalent hydrocarbon radical having 1 to 15 carbon atoms and containing a carboxyl or hydroxyl group, and the others each independently represents a hydrogen atom or a straight-chain, branched or cyclic alkyl group having 1 to 15 carbon atoms. $R^{005}$ to $R^{008}$ may be joined together to form a ring. In such a case, at least one of $R^{005}$ to $R^{008}$ represents a divalent hydrocarbon radical having 1 to 15 carbon atoms and At containing a carboxyl or hydroxyl group, and the others each independently represent a single bond or a straight-chain, By branched or cyclic alkylene group having 1 to 15 carbon F: atoms.

$R^{009}$ represents a univalent hydrocarbon radical having 2 to 15 carbon atoms and containing at least one partial structure selected from ether, aldehyde, ketone, ester, carbonate, acid anhydride, amide and imide structures. At least one of $R^{010}$ to $R^{013}$ represents a univalent hydrocarbon radical having 2 to 15 carbon atoms and containing at least one partial structure selected from ether, aldehyde, ketone, ester, carbonate, acid anhydride, amide and imide structures, and the others each independently represents a hydrogen atom or a straight-chain, branched or cyclic alkyl group having 1 to 15 carbon atoms. $R^{010}$ to $R^{013}$ may be joined together to form a ring. In such a case, at least one of $R^{010}$ to $R^{013}$ represents a divalent hydrocarbon radical having 1 to 15 carbon atoms and containing at least one partial structure selected from ether, aldehyde, ketone, ester, carbonate, acid anhydride, amide and imide structures, and the others each independently represent a single bond or a straight-chain, branched or cyclic alkylene group having 1 to 15 carbon atoms.

$R^{014}$ represents a polycyclic hydrocarbon radical having 7 to 15 carbon atoms, or an alkyl group containing a polycyclic hydrocarbon radical. $R^{015}$ represents an acid-labile group. X represents $CH_2$ or an oxygen atom. k is 0 or 1.

In the above formulas, $R^{001}$ represents a hydrogen atom, a methyl group or $CH_2CO_2R^{003}$ Specific examples of $R^{003}$ will be given below. $R^{002}$ represents a hydrogen atom, a methyl group or $CO_2R^{003}$. $R^{003}$ represents a straight-chain, branched or cyclic alkyl group having 1 to 15 carbon atoms. Specific examples thereof include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl.

$R^{004}$ represents a hydrogen atom or a univalent hydrocarbon radical having 1 to 15 carbon atoms and containing a carboxyl or hydroxyl group. Specific examples thereof include carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl and hydroxyadamantyl.

At least one of $R^{005}$ to $R^{008}$ represents a univalent hydrocarbon radical having 1 to 15 carbon atoms and containing a carboxyl or hydroxyl group, and the others each independently represents a hydrogen atom or a straight-chain, branched or cyclic alkyl group having 1 to 15 carbon atoms. Specific examples of the univalent hydrocarbon radical having 1 to 15 carbon atoms and containing a carboxyl or hydroxyl group include, carboxyl, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxy-ethoxycarbonyl, 4-hydroxybutoxycarbonyl, carboxycyclopentyl-oxycarbonyl, carboxycyclohexyloxycarbonyl, carboxynorbornyl-oxycarbonyl, carboxyadamantyloxycarbonyl, hydroxycyclopentyl-oxycarbonyl, hydroxycyclohexyloxycarbonyl, hydroxynorbornyl-oxycarbonyl and hydroxyadamantyloxycarbonyl. Specific examples of the straight-chain, branched or cyclic alkyl group having 1 to 15 carbon atoms are the same groups as enumerated for $R^{003}$. $R^{005}$ to $R^{008}$ may be joined together to form a ring. In such a case, at least one of $R^{005}$ to $R^{008}$ represents a divalent hydrocarbon radical having 1 to 15 carbon atoms and containing a carboxyl or hydroxyl group, and the others each independently represents a single bond or a straight-chain, branched or cyclic alkylene group having 1 to 15 carbon atoms. Specific examples of the divalent hydrocarbon radical having 1 to 15 carbon atoms and containing a carboxyl or hydroxyl group are groups formed by removing one hydrogen atom from the above-enumerated univalent hydrocarbon radicals containing a carboxyl or hydroxyl group. Specific examples of the straight-chain, branched or cyclic alkylene group having 1 to 15 carbon atoms are groups formed by removing one hydrogen atom from the groups enumerated for $R^{3}$.

$R^{009}$ represents a univalent hydrocarbon radical having 2 to 15 carbon atoms and containing at least one partial structure selected from ether, aldehyde, ketone, ester, carbonate, acid anhydride, amide and imide structures. Specific examples thereof include methoxymethyl, methoxyethoxymethyl, 2-oxooxolan-3-yl, 2-oxooxolan-4-yl, 4,4-dimethyl-2-oxooxolan-3-yl, 4-methyl-2-oxooxan-4-yl, 2-oxo-1,3-dioxolan-4-ylmethyl and 5-methyl-2-oxooxolan-5-yl.

At least one of $R^{010}$ to $R^{013}$ represents a univalent hydrocarbon radical having 2 to 15 carbon atoms and containing at least one partial structure selected from ether, aldehyde, ketone, ester, carbonate, acid anhydride, amide and imide structures, and the others each independently represents a hydrogen atom or a straight-chain, branched or cyclic alkyl group having 1 to 15 carbon atoms. Specific examples of the univalent hydrocarbon radical having 2 to 15 carbon atoms and containing at least one partial structure selected from ether, aldehyde, ketone, ester, carbonate, acid anhydride, amide and imide structures include methoxymethyl, methoxymethoxymethyl, formyl, methylcarbonyl, formyloxy, acetoxy, pivaloyloxy, formyloxymethyl, acetoxymethyl, pivaloyloxymethyl, methoxy-carbonyl, 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl and 5-methyl-2-oxooxolan-5-yloxycarbonyl. Specific examples of the straight-chain, branched or cyclic alkyl group having 1 to 15 carbon atoms are the same groups as enumerated for $R^{003}$.

$R^{010}$ to $R^{013}$ may be joined together to form a ring. In such a case, at least one of $R^{010}$ to $R^{013}$ represents a divalent hydrocarbon radical having 1 to 15 carbon atoms and containing at least one partial structure selected from ether, aldehyde, ketone, ester, carbonate, acid anhydride, amide and imide structures, and the others each independently represents a single bond or a straight-chain, branched or cyclic alkylene group having 1 to 15 carbon atoms. Specific examples of the divalent hydrocarbon radical having 1 to 15 carbon atoms and containing at least one partial structure selected from ether, aldehyde, ketone, ester, carbonate, acid anhydride, amide and imide structures include 2-oxapropane-1,3-diyl, 1,1-dimethyl-2-oxapropane-1,3-diyl, 1-oxo-2-oxapropane-1,3-diyl, 1,3-dioxo-2-oxapropane-1,3-diyl, 1-oxo-2-oxabutane-1,4-diyl and 1,3-dioxo-2-oxabutane-1,4-diyl, as well as groups formed by removing one hydrogen atom from the above-enumerated univalent hydrocarbon radicals having 1 to arm 15 carbon atoms and containing at least one partial structure selected from ether, aldehyde, ketone, ester, carbonate, acid anhydride, amide and imide structures. Specific examples of the straight-chain, branched or cyclic alkylene group having 1 to 15 carbon atoms are groups formed by removing one hydrogen atom from the groups enumerated for $R^{003}$.

$R^{014}$ represents a polycyclic hydrocarbon radical having 7 to 15 carbon atoms, or an alkyl group containing a polycyclic hydrocarbon radical. Specific examples thereof include norbornyl, bicyclo[3.3.1]nonyl, tricyclo[5.2.1.0$^{2,6}$]decyl, adamantyl, ethyladamantyl, butyladamantyl, norbornylmethyl and adamantylmethyl. $R^{015}$ represents an acid-labile group. Specific examples thereof are the same groups as enumerated previously. X represents $CH_2$ or an oxygen atom. k is 0 or 1.

The repeating units represented by the general formulas (M1) to (M8–2) serve to impart various characteristics, such as affinity for developers, adhesion to the substrate, and etching resistance, to the resulting resist material. Accordingly, the properties of the resist material can be closely controlled by regulating the contents of these repeating units properly.

The polymers of the present invention have a weight-average molecular weight of 1,000 to 500,000 and preferably 3,000 to 100,000, as measured on a polystyrene basis by gel permeation chromatography (GPC). If the molecular weight is outside this range, the resulting resist material may show an extreme reduction in etching resistance or may fail to secure a sufficient difference between dissolution rates before and after exposure, resulting in a reduction in resolving power.

The polymers of the present invention may be prepared by a copolymerization reaction using a first monomer comprising a compound represented by the following general formula (1a), one to three monomers selected from second to fourth monomers comprising compounds represented by the following general formulas (2a) to (4a), and if necessary, one or more additional monomers selected from compounds represented by the following general formula (M1a) to (M8a).

(1a)

(2a)

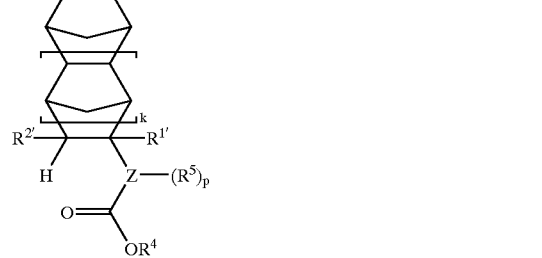

(3a)

(4a)

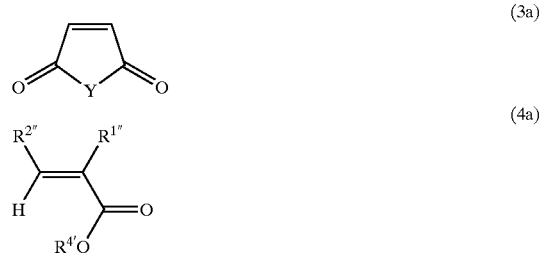

wherein k, p, $R^1$ to $R^5$, $R^{1'}$ to $R^{4'}$, $R^{1''}$ to $R^{3'''}$, W. Y and Z are as defined above.

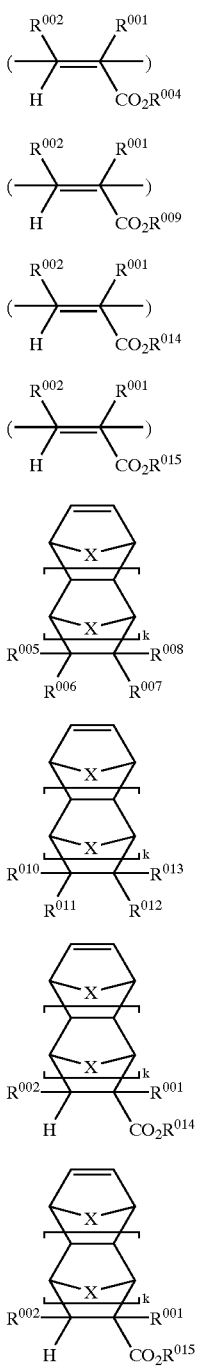

(M1a)
(M2a)
(M3a)
(M4a)
(M5a)
(M6a)
(M7a)
(M8a)

wherein k, $R^{001}$ to $R^{015}$, and X are as defined above.

In this copolymerization reaction, a polymer which exhibits desired properties when used in resist materials can be prepared by regulating the proportions of various monomers properly.

When the polymers of the present invention are prepared by a copolymerization reaction, there may be used not only (i) the monomers of the above formula (1a), (ii) the monomers of the above formulas (2a) to (4a), and (iii) the monomers of the above formulas (M1a) to (M8a), but also (iv) monomers having a carbon-to-carbon double bond, other than the aforesaid monomers (i) to (iii). Such monomers of (iv) include, for example, substituted acrylic esters such as methyl methacrylate, methyl crotonate, dimethyl maleate and dimethyl itaconate; unsaturated carboxylic acids such as maleic acid, fumaric acid and itaconic acid; substituted norbornenes such as norbornene and methyl norbornene-5-carboxylate; and unsaturated acid anhydrides such as itaconic anhydride.

In the polymers of the present invention, the repeating units derived from various monomers may be present, for example, in the respective contents (in mole %) given below. However, it is to be understood that the present invention is not limited thereto.

(I) In the case of a polymer containing repeating units represented by the above general formula (1-1) and repeating units represented by the above general formula (2-1), it may contain:

① 1 to 90 mole %, preferably 5 to 80 mole %, and more preferably 10 to 70 mole % of repeating units derived from the monomer of formula (1a) and represented by formula (1-1);

② 1 to 90 mole %, ferably 5 to 80 mole %, and more preferably 10 to 70 mole % of repeating units derived from the monomer of formula (2a) and represented by formula (2-1);

③ 0 to 50 mole %, preferably 0 to 40 mole %, and more preferably 0 to 30 mole % of repeating units derived from the monomers of formulas (M5a) to (M8a) and represented by formulas (M5-1) to (M8-1); and ④ 0 to 50 mole %, preferably 0 to 40 mole %, and more preferably 0 to 30 mole % of repeating units derived from other monomers.

(II) In the case of a polymer containing repeating units represented by the above general formula (1-1), repeating units represented by the above general formula (2-1), and repeating units represented by the above general formula (3), it may contain:

① 1 to 49 mole %, preferably 3 to 45 mole %, and more preferably 5 to 40 mole % of repeating units derived from the monomer of formula (1a) and represented by formula (1-1);

② 1 to 49 mole %, preferably 3 to 45 mole %, and more preferably 5 to 40 mole % of repeating units derived from the monomer of formula (2a) and represented by formula (2-1);

③ 50 mole % of repeating units derived from the monomer of formula (3a) and represented by formula (3);

④ 0 to 25 mole %, preferably 0 to 20 mole %, and more preferably 0 to 15 mole % of repeating units derived from the monomers of formulas (M5a) to (M8a) and represented by formulas (M5-1) to (M8-1); and ⑤ 0 to 25 mole %, preferably 0 to 20 mole %, and more preferably 0 to 15 mole % of repeating units derived from other monomers.

(III) In the case of a polymer containing repeating units represented by the above general formula (1-1), repeating units represented by the above general formula (4) and repeating units represented by the above general formula (3); or a polymer containing repeating units represented by the above general formula (1-1), repeating units represented by the above general formula (2-1), repeating units represented by the above general formula (4) and repeating units represented by the above general formula (3); it may contain:

① 1 to 49 mole %, preferably 3 to 45 mole %, and more preferably 5 to 40 mole % of repeating units derived from the monomer of formula (1a) and represented by formula (1-1);

② 0 to 40 mole %, preferably 0 to 35 mole %, and more preferably 0 to 30 mole % of repeating units derived from the monomer of formula (2a) and represented by formula (2-1);

③ 1 to 80 mole %, preferably 1 to 70 mole %, and more preferably 1 to 50 mole % of repeating units derived from the monomer of formula (4a) and represented by formula (4);

④ 1 to 49 mole %, preferably 5 to 45 mole %, and more preferably 10 to 40 mole % of repeating units derived from the monomer of formula (3a) and represented by formula (3);

⑤ 0 to 25 mole %, preferably 0 to 20 mole %, and more preferably 0 to 15 mole % of repeating units derived from the monomers of formulas (M1a) to (M8a) and represented by formulas (M1) to (M8-1); and ⑥ 0 to 25 mole %, preferably 0 to 20 mole %, and more preferably 0 to 15 mole % of repeating units derived from other monomers.

(IV) In the case of a polymer containing repeating units represented by the above general formula (1-2) and repeating units represented by the above general formula (2-2), it may contain:

① 1 to 90 mole %, preferably 5 to 80 mole %, and more preferably 10 to 70 mole % of repeating units derived from the monomer of formula (1a) and represented by formula (1-2);

② 1 to 90 mole %, preferably 5 to 80 mole %, and more preferably 10 to 70 mole % of repeating units derived from the monomer of formula (2a) and represented by formula (2-2);

③ 0 to 50 mole %, preferably 0 to 40 mole %, and more preferably 0 to 30 mole % of repeating units derived from-the monomers of formulas (M5a) to (M8a) and represented by formulas (M5-2) to (M8-2); and ④ 0 to 50 mole %, preferably 0 to 40 mole %, and more preferably 0 to 30 mole % of repeating units derived from other monomers.

The monomers from which the repeating units of the general formulas (1-1) and (1-2) characterizing the polymers of the present invention are derived may be synthesized by effecting the Diels-Alder reaction between a compound having a double bond (e.g., an acrylic acid derivative, a vinyl ether or a vinyl ester) and furan to construct a 7-oxabicyclo [2.2.1]heptane ring, and then modifying the substituent moieties according to well-known organic chemical techniques.

The copolymerization reactions for preparing the polymers of the present invention may take a variety of forms. However, radical polymerization, anionic polymerization and coordination polymerization are preferred.

As to the reaction conditions for radical polymerization, it is preferable (a) to use a solvent selected from hydrocarbons such as benzene; ethers such as tetrahydrofuran; alcohols such as ethanol; and ketones such as methyl isobutyl ketone, (b) to use a polymerization initiator selected from azo compounds such as 2,2'-azobisisobutyronitrile; and peroxides such as benzoyl peroxide and lauroyl peroxide, (c) to maintain the reaction temperature in the range of about 0 to 100° C., and (d) to use a reaction time ranging from about 0.5 hour to about 48 hours. However, it is to be understood that reaction conditions outside the aforesaid ranges are not precluded.

As to the reaction conditions for anionic polymerization, it is preferable (a) to use a solvent selected from hydrocarbons such as benzene; ethers such as tetrahydrofuran; and liquid ammonia, (b) to use a polymerization initiator selected from metals such as sodium and potassium; alkyl metals such as n-butyl lithium and sec-butyl lithium; ketyls; and Grignard reagents, (c) to maintain the reaction temperature in the range of about −78 to 0° C., (d) to use a reaction time ranging from about 0.5 hour to about 48 hours, and (e) to use a stopper selected from proton-donating compounds such as methanol; halides such as methyl iodide; and other electrophilic substances. However, it is to be understood that reaction conditions outside the aforesaid ranges are not precluded.

As to the reaction conditions for coordination polymerization, it is preferable (a) to use a solvent selected from hydrocarbons such as n-heptane and toluene, (b) to use a catalyst selected from Ziegler-Natta catalysts formed from a transition metal (e.g., titanium) and an alkylaluminum; Phillips catalysts comprising chromium and nickel compounds carried on a metal oxide; and olefin-metathesis mixed catalysts typified by tungsten-rhenium mixed catalyst, (c) to maintain the reaction temperature in the range of about 0 to 100° C., and (d) to use a reaction time ranging from about 0.5 hour to about 48 hours. However, it is to be understood that reaction conditions outside the aforesaid ranges are not precluded.

The polymers of the present invention are useful as base polymers for resist materials, and the present invention provides resist materials (in particular, chemical amplification positive resist materials) containing these polymers.

The resist materials of the present invention may also contain compounds capable of forming an acid in response to high-energy radiation or electron rays (hereinafter referred to as acid generators), organic solvents, and other ingredients as required.

The acid generators which can be used in the present invention include:

(i) onium salts of the following general formula (P1a-1), (P1a-2) or (P1b);

(ii) diazomethane derivatives of the following general formula (P2);

(iii) glyoxime derivatives of the following general formula (P3);

(iv) bis-sulfone derivatives of the following general formula (P4);

(v) sulfonic acid esters of N-hydroxyimide compounds of the following general formula (P5);

(vi) β-ketosulfonic acid derivatives;

(vii) disulfone derivatives;

(viii) nitrobenzyl sulfonate derivatives;

(ix) sulfonic acid ester derivatives; and the like.

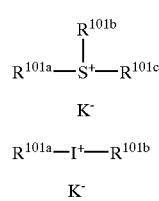

wherein $R^{101a}$, $R^{101b}$ and $R^{101c}$ each represents a straight-chain, branched or cyclic alkyl, alkenyl, oxoalkyl or oxoalkenyl group having 1 to 12 carbon atoms, an aryl group having 6 to 20 carbon atoms, or an aralkyl or aryloxoalkyl group having 7 to 12 carbon atoms, and the hydrogen atoms present in these groups may be partially or completely replaced by alkoxy groups or the like. Moreover, $R^{101b}$ and $R^{101c}$ may form a ring. When they form a ring, $R^{101b}$ and $R^{101c}$ each represents an alkylene group having 1 to 6 carbon atoms. K⁻ represents a non-nucleophilic counter ion.

The above $R^{101a}$, $R^{101b}$ and $R^{101c}$ may be the same or different from each other. Specific examples of the alkyl group include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl and adamantyl. Specific examples of the alkenyl group include vinyl, allyl, propenyl, butenyl, hexenyl and cyclohexenyl. Specific examples of the oxoalkyl group include 2-oxycyclopentyl and 2-oxycyclohexyl, as well as 2-oxopropyl, 2-cyclopentyl-2-oxoethyl, 2-cyclohexyl-2-oxoethyl and 2-(4-methylcyclohexyl)-2-oxoethyl. Specific examples of the aryl group include phenyl and naphthyl; alkoxyphenyl groups such as p-methoxyphenyl, m-methoxyphenyl, o-methoxyphenyl, ethoxyphenyl, p-tert-butoxyphenyl and m-tert-butoxyphenyl; alkylphenyl groups such as 2-methylphenyl, 3-methylphenyl, 4-methylphenyl, ethylphenyl, 4-tert-butylphenyl, 4-butylphenyl and dimethylphenyl; alkylnaphthyl groups such as a methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Specific examples of the aralkyl group include benzyl, phenylethyl and phenethyl. Specific examples of the aryloxoalkyl group include 2-aryl-2-oxoethyl groups such as 2-phenyl-2-oxoethyl, 2-(1-naphthyl)-2-oxoethyl and 2-(2-naphthyl)-2-oxoethyl. Specific examples of the non-nucleophilic counter ion represented by K⁻ include halide ions such as chloride ion and bromide ion; fluoroalkylsulfonates such as triflate, 1,1,1-trifluoroethanesulfonate and nonafluorobutanesulfonate; arylsulfonates such as tosylate, benzenesulfonate, 4-fluorobenzenesulfonate and 1,2,3,4,5-pentafluorobenzenesulfonate; and alkylsulfonates such as mesylate and butanesulfonate.

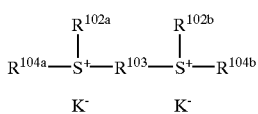

P1b wherein $R^{102a}$ and $R^{102b}$ each represents a straight-chain, branched or cyclic alkyl group having 1 to 8 carbon atoms, $R^{103}$ represents a straight-chain, branched or cyclic alkylene group having 1 to 10 carbon atoms, $R^{104a}$ and $R^{104b}$ each represents a 2-oxoalkyl group having 3 to 7 carbon atoms, and K⁻ represents a non-nucleophilic counter ion.

Specific examples of the above $R^{102}$a and $R^{102b}$ include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl and cyclohexylmethyl.

Specific examples of the above $R^{103}$ include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene and 1,4-cyclohexane-dimethylene. Specific examples of the above $R^{104a}$ and $R^{104b}$ include 2-oxopropyl, 2-oxocyclopentyl, 2-oxocyclohexyl and 2-oxocycloheptyl. Specific examples of the above K⁻ are the same ions as enumerated for formulas (P1a-1) and (P1a-2).

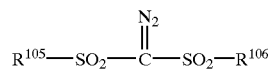

P2 wherein $R^{105}$ and $R^{106}$ each represents a straight-chain, branched or cyclic alkyl or haloalkyl group having 1 to 12 carbon atoms, an aryl or haloaryl group having 6 to 20 carbon atoms, or an aralkyl group having 7 to 12 carbon atoms.

Specific examples of the alkyl group represented by $R^{105}$ and $R^{106}$ include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl and adamantyl. Specific examples of the haloalkyl group include trifluoromethyl, 1,1,1-trifluoroethyl, 1,1,1-trichloroethyl and nonafluorobutyl. Specific examples of the aryl group include phenyl; alkoxyphenyl groups such as p-methoxyphenyl, m-methoxyphenyl, o-methoxyphenyl, ethoxyphenyl, p-tert-butoxyphenyl and m-tert-butoxyphenyl; and alkylphenyl groups such as 2-methylphenyl, 3-methylphenyl, 4-methylphenyl, ethylphenyl, 4-tert-butylphenyl, 4-butylphenyl and dimethylphenyl. Specific examples of the haloaryl group include fluorophenyl, chlorophenyl and 1,2,3,4,5-pentafluorophenyl. Specific examples of the aralkyl group include benzyl and-phenethyl.

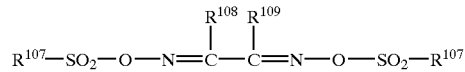

P3 wherein $R^{107}$, $R^{108}$ and $R^{109}$ each represents a straight-chain, branched or cyclic alkyl or haloalkyl group having 1 to 12 carbon atoms, an aryl or haloaryl group having 6 to 20 carbon atoms, or an aralkyl group having 7 to 12 carbon atoms. $R^{108}$ and $R^{109}$ may be joined together to form a cyclic structure. When they form a cyclic structure, $R^{108}$ and $R^{109}$ each represents a straight-chain or branched alkylene group having 1 to 6 carbon atoms.

Specific examples of the alkyl, haloalkyl, aryl, haloaryl and aralkyl groups represented by $R^{107}$, $R^{108}$ and $R^{109}$ are the same as enumerated for $R^{105}$ and $R^{106}$. Specific examples of the alkylene group represented by $R^{108}$ and $R^{109}$ include methylene, ethylene, propylene, butylene and hexylene.

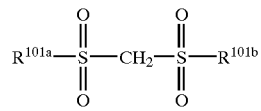

P4 wherein $R^{101a}$ and $R^{101b}$ are as defined above.

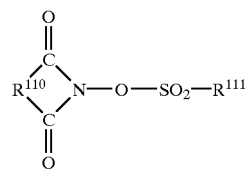

P5 wherein $R^{110}$ represents an arylene group having 6 to 12 carbon atoms, an alkylene group having 1 to 6 carbon atoms, or an alkenylene group having 2 to 6 carbon atoms, and the hydrogen atoms present in these groups may further be partially or completely replaced by straight-chain or branched alkyl or alkoxy groups having 1 to 4 carbon atoms, nitro groups, acetyl groups or phenyl groups. $R^{111}$ represents a straight-chain, branched or substituted alkyl, alkenyl or alkoxyalkyl group having 1 to 8 carbon atoms, a phenyl group or a naphthyl group, and the hydrogen atoms present in these groups may further be partially or completely replaced by alkyl or alkoxy groups having 1 to 4 carbon atoms; phenyl groups which may be substituted by an alkyl or alkoxy group having 1 to 4 carbon atoms, a nitro group or an acetyl group; heteroaromatic groups having 3 to 5 carbon atoms; or chlorine or fluorine atoms.

Specific examples of the arylene group represented by $R^{110}$ include 1,2-phenylene and 1,8-naphthylene; specific examples of the alkylene group include methylene, ethylene, trimethylene, tetramethylene, phenylethylene and norbornane-2,3-diyl; and specific examples of the alkenylene group include 1,2-vinylene, 1-phenyl-1,2-vinylene and 5-norbornene-2,4-diyl. Specific examples of the alkyl group represented by $R^{111}$ are the same as enumerated for $R^{101a}$ to $R^{101c}$. Specific examples of the alkenyl group include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl and 7-octenyl. Specific examples of the alkoxyalkyl group include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl and methoxyheptyl.

As to substituent groups, specific examples of the alkyl groups having 1 to 4 carbon-atoms include methyl, ethyl, propyl, isopropyl, n-butyl, isobutyl and tert-butyl. Specific examples of the alkoxy groups having 1 to 4 carbon atoms include methoxy, ethoxy, propoxy, isopropoxy, n-butoxy, isobutoxy and tert-butoxy. Specific examples of the phenyl groups which may be substituted by an alkyl or alkoxy group having 1 to 4 carbon atoms, a nitro group or an acetyl group include phenyl, tolyl, p-tert-butoxyphenyl, p-acetylphenyl and p-nitrophenyl. Specific examples of the heteroaromatic groups having 3 to 5 carbon atoms include pyridyl and furyl.

Specifically, useful acid generators include onium salts, diazomethane derivatives, glyoxime derivatives, bis-sulfone derivatives, β-ketosulfonic acid derivatives, disulfone derivatives, nitrobenzyl sulfonate derivatives, sulfonic acid ester derivatives, sulfonic acid ester derivatives of N-hydroxyimide compounds, and the like.

Specific examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)-phenyliodonium p-toluenesulfonate, triphenylsulfonium trifluoromethanesulfonate, (p-tert-butoxyphenyl)diphenyl-sulfonium trifluoromethanesulfonate, bis(p-tert-butoxyphenyl)-phenylsulfonium trifluoromethanesulonate, tris (p-tert-butoxyphenyl)sulfonium trifluoromethanesulfonate, triphenyl-sulfonium p-toluenesulfonate, (p-tert-butoxyphenyl)diphenyl-sulfonium p-toluenesulfonate, bis(p-tert-butoxyphenyl) phenyl-sulfonium p-toluenesulfonate, tris(p-tert-butoxyphenyl)-sulfonium p-toluenesulfonate, triphenylsulfonium nonafluoro-butanesulfonate, triphenyl-sulfonium butanesulfonate, trimethylsulfonium trifluoromethanesulfonate, trimethyl-sulfonium p-toluenesulfonate, cyclohexylmethyl(2-oxo-cyclohexyl) sulfonium trifluoromethanesulfonate, cyclohexyl-methyl(2-oxocyclohexyl)sulfonium p-toluenesulfonate, dimethyl-phenylsulfonium trifluoromethanesulfonate, dimethylphenyl-sulfonium p-toluenesulfonate, dicyclohexylphenylsulfonium trifluoromethanesulfonate, dicyclohexylphenylsulfonium p-toluenesulfonate, trinaphthylsulfonium trifluoromethane-sulfonate, cyclohexylmethyl(2-oxocyclohexyl)sulfonium trifluoromethanesulfonate, (2-norbornyl)methyl(2-oxo-cyclohexyl)sulfonium trifluoromethanesulfonate, ethylene-bis[methyl(2-oxocyclopentyl)sulfonium trifluoromethane-sulfonate] and 1,2'-naphthylcarbonylmethyltetrahydro-thiophenium triflate.

Specific examples of the diazomethane derivatives If include bis(benzenesulfonyl)diazomethane, bis(p-toluenesulfonyl)diazomethane, bis(xylenesulfonyl) diazomethane, bis(cyclohexylsulfonyl)diazomethane, bis (cyclopentylsulfonyl)-diazomethane, bis(n-butylsulfonyl) diazomethane, bis(isobutyl-sulfonyl)diazomethane, bis(sec-butylsulfonyl)diazomethane, bis(n-propylsulfonyl) diazomethane, bis(isopropylsulfonyl)-diazomethane, bis (tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl)-diazomethane, 1-cyclohexylsulfonyl-1-(tert-butylsulfonyl)-diazomethane, 1-cyclohexylsulfonyl-1-(tert-amylsulfonyl)-diazomethane and 1-tert-amylsulfonyl-1-(tert-butylsulfonyl)-diazomethane.

Specific examples of the glyoxime derivatives include bis-O-(p-toluenesulfonyl)-α-dimethylglyoxime, bis-O-(p-toluenesulfonyl)-α-diphenylglyoxime, bis-O-(p-toluene-sulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenyl-glyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-o-(trifluoro-methanesulfonyl)-α-dimethylglyoxime, bis-O-(1,1,1-trifluoro-ethanesulfonyl)-α-dimethylglyoxime, bis-O-(tert-butane-sulfonyl)-α-dimethylglyoxime, bis-O-(perfluorooctane-sulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylene-sulfonyl)-α-dimethylglyoxime and bis-O-(camphorsulfonyl)-α-dimethylglyoxime.

Specific examples of the bis-sulfone derivatives include bisnaphthylsulfonylmethane, bistrifluoromethylsulfonylmethane, bismethylsulfonylmethane, bisethylsulfonylmethane, bispropyl-sulfonylmethane, bisisopropylsulfonylmethane, bis-p-toluene-sulfonylmethane and bisbenzenesulfonylmethane.

Specific examples of the β-ketosulfone derivatives include 2-cyclohexylcarbonyl-2-(p-toluenesulfonyl)propane and 2-isopropylcarbonyl-2-(p-toluenesulfonyl)propane.

Specific examples of the disulfone derivatives include diphenyldisulfone and dicyclohexyldisulfone.

Specific examples of the nitrobenzyl sulfonate derivatives include 2,6-dinitrobenzyl p-toluenesulfonate and 2, d-dinitrobenzyl p-toluenesulfonate.

Specific examples of the sulfonic acid ester derivatives include 1,2,3-tris(methanesulfonyloxy)benzene, 1,2,3-tris(trifluoromethanesulfonyloxy)benzene and 1,2,3-tris(p-toluenesulfonyloxy)benzene.

Specific examples of the sulfonic acid ester derivatives of N-hydroxyimide compounds include N-hydroxysuccinimide methanesulfonate, N-hydroxysuccinimide trifluoromethane-sulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzene-sulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalene-sulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxy-phthalimide p-toluenesulfonate, N-hydroxynaphthalimide methanesulfonate, N-hydroxynaphthalimide benzenesulfonate, N-hydroxy-5-norbornene-2,3-dicarboximide methanesulfonate, N-hydroxy-5-norbornene-2,3-dicarboximide trifluoromethane-sulfonate and N-hydroxy-5-norbornene-2,3-dicarboximide p-toluenesulfonate.

Preferred examples of the acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)-diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)-sulfonium trifluoromethanesulfonate, (2-norbornyl)methyl(2-oxocyclohexyl)sulfonium trifluoromethanesulfonate and 1,2'-naphthylcarbonylmethyltetrahydrothiophenium triflate; diazomethane derivatives such as bis(benzenesulfonyl)-diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane and bis(tert-butyl-sulfonyl)diazomethane; glyoxime derivatives such as bis-O-(p-toluenesulfonyl)-α-dimethylglyoxime and bis-O-(n-butane-sulfonyl)-α-dimethylglyoxime; bis-sulfone derivatives such as bisnaphthylsulfonylmethane; and sulfonic acid ester derivatives of N-hydroxyimide compounds such as N-hydroxy-succinimide methanesulfonate, N-hydroxysuccinimide trifluoro-methanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate and N-hydroxynaphthalimide benzenesulfonate.

The above-described acid generators may be used alone or in admixture of two or more. Since the onium salts are highly effective in improving rectangularity and the diazomethane derivative and the glyoxime derivatives are highly effective in reducing standing waves, the fine adjustment of profiles can be made by the combined use of them.

The above-described acid generators are preferably added in an amount of 0.1 to 15 parts by weight and more preferably 0.5 to 8 parts by weight, per 100 parts by weight of the base resin. If their amount added is less than 0.1 part by weight, the resulting resist material may have poor sensitivity, and if it is greater than 15 parts by weight, the resulting resist material may have low transparency and show a reduction in resolving power.

The organic solvent used in the present invention may comprise any organic solvent that can dissolve base resins, acid generators, other additives and the like. Such organic solvents include, for example, ketones such as cyclohexanone and methyl 2-n-amyl ketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate and propylene glycol mono-tert-butyl ether acetate; and lactones such as γ-butyrolactone. These organic solvents may be used alone or in admixture of two or more. However, it is to be understood that the present invention is not limited thereto.

Among these organic solvents, diethylene glycol dimethyl ether and 1-ethoxy-2-propanol, which have the greatest dissolving power for acid generators included in resist components, and propylene glycol monomethyl ether acetate and its solvent mixtures, which are safe solvents, are preferably used in the present invention.

The organic solvent is preferably used in an amount of 200 to 1,000 parts by weight and more preferably 400 to 800 parts by weight, per 100 parts by weight of the base resin.

Besides the polymers containing repeating units represented by the above formula (1-1) or (1-2), other polymers may be added to the resist materials of the present invention.

Specific examples of such polymers include polymers represented by the following formula (R1) and/or the following formula (R2) and having a weight-average molecular weight of 1,000 to 500,000 and preferably 5,000 to 100,000. However, it is to be understood that the present invention is not limited thereto.

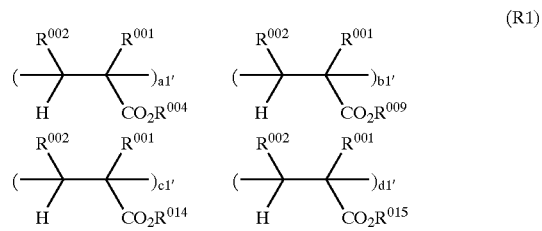
(R1)

-continued

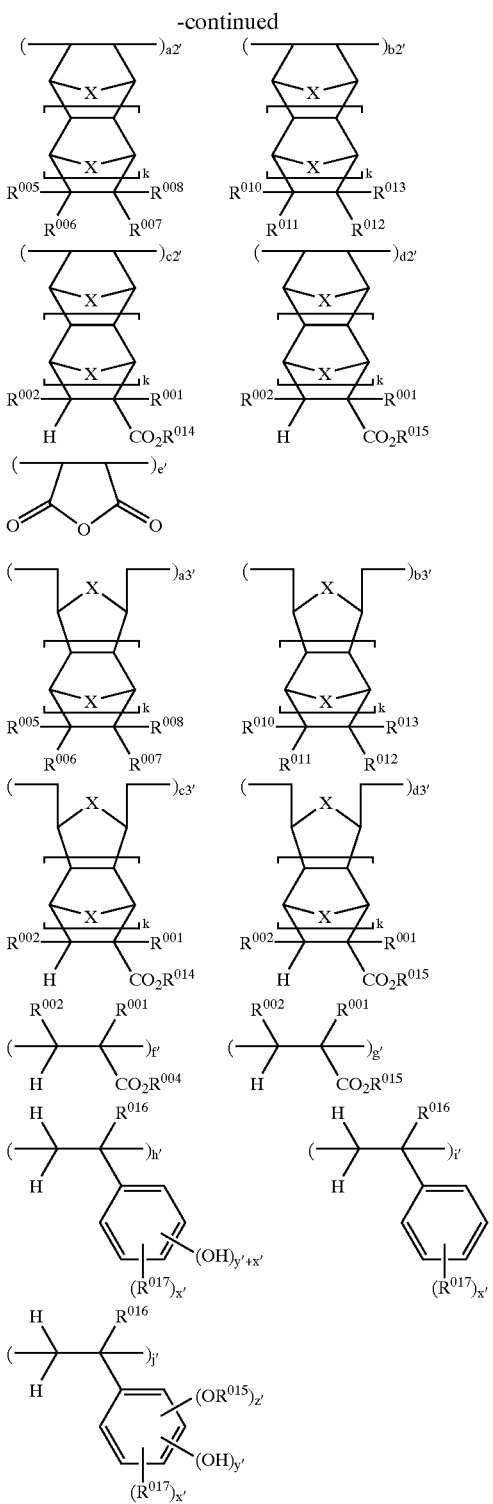

wherein $R^{001}$ represents a hydrogen atom, a methyl group or $CH_2CO_2R^{003}$. $R^{002}$ represents a hydrogen atom, a methyl group or $C_2R^{003}$. $R^{003}$ represents a straight-chain, branched or cyclic alkyl group having 1 to 15 carbon atoms. $R^{004}$ represents a hydrogen atom or a univalent hydrocarbon radical having 1 to 15 carbon atoms and containing a carboxyl or hydroxyl group. At least one of $R^{005}$ to $R^{008}$ represents a univalent hydrocarbon radical having 1 to 15 carbon atoms and containing a carboxyl- or hydroxyl group, and the others each independently represents a straight-chain, branched or cyclic alkyl group having 1 to 15 carbon atoms. $R^{005}$ to $R^{008}$ may be joined together to form a ring. In such a case, at least one of $R^{005}$ to $R^{008}$ represents a divalent hydrocarbon radical having 1 to 15 carbon atoms and containing a carboxyl or hydroxyl group, and the others each independently represents a single bond or a straight-chain, branched or cyclic alkylene group having 1 to 15 carbon atoms.

$R^{009}$ represents a univalent hydrocarbon radical having 2 to 15 carbon atoms and containing at least one partial structure selected from ether, aldehyde, ketone, ester, carbonate, acid anhydride, amide and imide structures. At least one of $R^{010}$ to $R^{013}$ represents a univalent hydrocarbon radical having 2 to 15 carbon atoms and containing at least one partial structure selected from ether, aldehyde, ketone, ester, carbonate, acid anhydride, amide and imide structures, and the others each independently represents a hydrogen atom or a straight-chain, branched or cyclic alkyl group having 1 to 15 carbon atoms. $R^{010}$ to $R^{013}$ may be joined together to form a ring. In such a case, at least one of $R^{010}$ to $R^{013}$ represents a divalent hydrocarbon radical having 1 to 15 carbon atoms and containing at least one partial structure selected from ether, aldehyde, ketone, ester, carbonate, acid anhydride, amide and imide structures, and the others each independently represents a single bond or a straight-chain, branched or cyclic alkylene group having 1 to 15 carbon atoms.

$R^{014}$ represents a polycyclic hydrocarbon radical having 7 to 15 carbon atoms, or an alkyl group containing a polycyclic hydrocarbon radical. $R^{015}$ represents an acid-labile group. $R^{016}$ represents a hydrogen atom or a methyl group. $R^{017}$ represents a straight-chain, branched or cyclic alkyl group having 1 to 8 carbon atoms. X represents $CH_2$ or an oxygen atom. k' is 0 or 1. a1', a2', a3', b1', b2', b3', c1', c2', c3', d1', d2', d3' and e' are each a number ranging from 0 (inclusive) to 1 (exclusive), and satisfy the condition defined by a1'+a2'+a3'+b1'+b2'+b3'+c1'+c2'+c3'+d1'+d2'+d3'+e'=1. f', g', h', i' and j', are each a number ranging from 0 (inclusive) to 1 (exclusive), and satisfy the condition defined by f'+g'+h'+i'+j'=1.

x', y' and z' are each an integer of 0 to 3, and satisfy the condition defined by $1 \leq x'+y'+z' \leq 5$ and $1 \leq y'+z' \leq 3$.

Specific examples of the respective groups are the same as described previously.

The compounding ratio of the polymer containing repeating units represented by the above general formula (1-1) or (1-2) to other polymers is preferably in the range of 0:100 to 90:10 and more preferably 0:100 to 80:20, on a weight basis. If the amount of the polymer containing repeating units represented by the above general formula (1-1) or (1-2) is less than the aforesaid lower limit, the resulting resist material may fail to exhibit desirable properties. The properties of the resist material can be controlled by varying the aforesaid compounding ratio appropriately.

The above-described polymers may be added alone or in admixture of two or more. The properties of the resist material can be controlled by using a plurality of polymers.

Moreover, dissolution controllers may be added to the resist materials of the present invention. As the dissolution controllers, there may preferably be used compounds having an average molecular weight of 100 to 1,000 and more preferably 150 to 800 and having two or more phenolic hydroxyl groups in the molecule, in which the hydrogen atoms in the phenolic hydroxyl groups are replaced by acid-labile groups in a proportion of 0 to 100 mole % on the average of the whole compound, or compounds having a carboxyl group in the molecule, in which the hydrogen atom in the carboxyl group is replaced by an acid-labile group in a proportion of 50 to 100 mole % on the average of the whole compound.

The degree of replacement of the hydrogen atoms in the phenolic hydroxyl groups by acid-labile groups is, on the average, not less than 0 mole % and preferably not less than 30 mole % based on all phenolic hydroxyl groups. Its upper limit is 100 mole % and preferably 80 mole %. The degree of replacement of the hydrogen atom in the carboxyl group by an acid-labile group is, on the average, not less than 50 mole % and preferably not less than 70 mole % based on all carboxyl groups. Its upper limit is 100 mole %.

In this case, preferred examples of the compounds having two or more phenolic hydroxyl groups and the compounds having a carboxyl group include compounds represented by the following formulas (D1) to (D14).

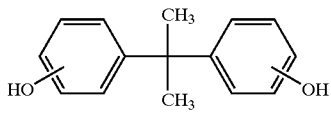

D1

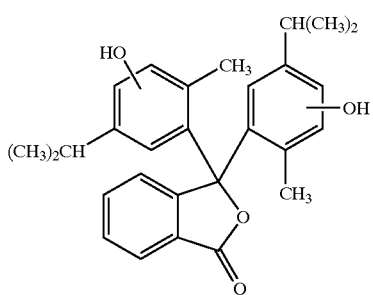

D2

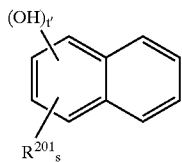

D3

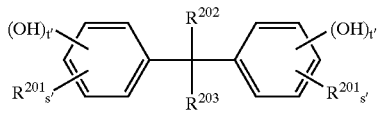

D4

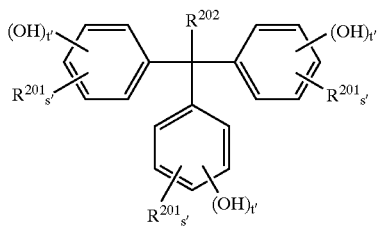

D5

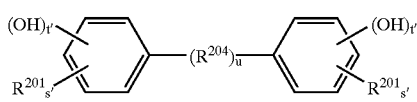

D6

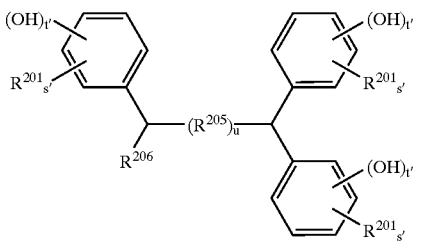

D7

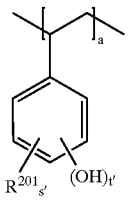

D8

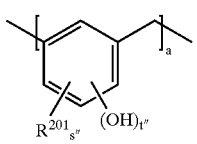

D9

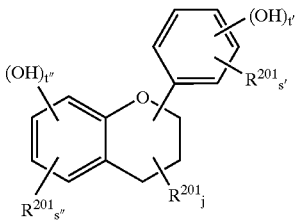

D10

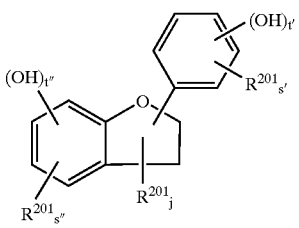

D11

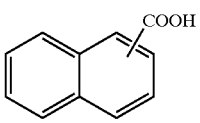

D12

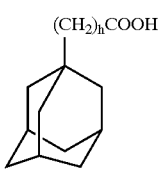

D13

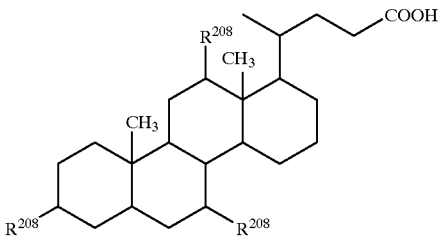

D14 wherein $R^{201}$ and $R^{202}$ each represents a hydrogen atom or a straight-chain or branched alkyl or alkenyl group having 1 to 8 carbon atoms; $R^{203}$ represents a hydrogen atom, a straight-chain or branched alkyl or alkenyl group having 1 to 8 carbon atoms, or a group of the formula —($R^{207}$)h—COOH; $R^{204}$ represents —($CH_2$)i— (in which i is an integer of 2 to 10), an arylene group having 6 to 10 carbon atoms, a carbonyl group, a sulfonyl group, an oxygen atom or a sulfur atom; $R^{205}$ represents an alkylene group having 1 to 10 carbon atoms, an arylene group having 6 to 10 carbon atoms, a carbonyl group, a sulfonyl group, an oxygen atom or a sulfur atom; $R^{206}$ represents a hydrogen atom, a straight-chain or branched alkyl or alkenyl group having 1 to 8 carbon atoms, or a hydroxyl-substituted phenyl or naphthyl group; $R^{207}$ represents a straight-chain or branched alkylene group having 1 to 10 carbon atoms; $R^{208}$ represents a hydrogen atom or a hydroxyl group; j is an integer of 0 to 5; u and h are each 0 or 1; s, t, s', t', s" and t" are numbers which satisfy the conditions defined by s+t=8, s'+t'=5, s"+t"=4, and which cause at least one hydroxyl group to be present in each phenyl skeleton; and . is a number which causes the compound of formula (D8) or (D9) to have a molecular weight of 100 to 1,000.

Specific examples of $R^{201}$ and $R^{202}$ in the above formulas include hydrogen, methyl, ethyl, butyl, propyl, ethynyl and cyclohexyl. Specific examples of $R^{203}$ include the same groups as enumerated for $R^{201}$ and $R^{202}$, as well as —COOH and —$CH_2$COOH. Specific examples of $R^{204}$ include ethylene, phenylene, carbonyl, sulfonyl, oxygen and sulfur. Specific examples of $R^{205}$ include methylene and the same groups as enumerated for $R^{204}$. Specific examples of $R^{206}$ include hydrogen, methyl, ethyl, butyl, propyl, ethynyl, cyclohexyl, hydroxyl-substituted phenyl, and hydroxyl-substituted naphthyl.

A variety of acid-labile groups may be used for the dissolution controllers. Specific examples thereof include groups represented by the following general formulas (L1) to (L4), tertiary alkyl groups having 4 to 20 carbon atoms, trialkylsilyl groups in which each alkyl group has 1 to 6 carbon atoms, and oxoalkyl groups having 4 to 20 carbon atoms.

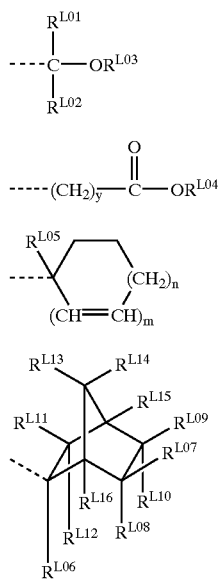

wherein $R^{L01}$ and $R^{L02}$ each represent a hydrogen atom or a straight-chain, branched or cyclic alkyl group having 1 to 18 carbon atoms. $R^{L03}$ represents a univalent hydrocarbon radical having 1 to 18 carbon atoms and optionally containing one or more heteroatoms such as oxygen atoms. $R^{L01}$ and $R^{L02}$, $R^{L01}$ and $R^{L03}$, or $R^{L02}$ and $R^{L03}$ may form a ring. When they form a ring, $R^{L01}$, $R^{L02}$ and $R^{L03}$ each represents a straight-chain or branched alkylene group having 1 to 18 carbon atoms. $R^{L04}$ represents a tertiary alkyl group having 4 to 20 carbon atoms, a trialkylsilyl group in which each alkyl group has 1 to 6 carbon atoms, an oxoalkyl group having 4 to 20 carbon atoms, or a group represented by the above general formula (L1). $R^{L05}$ represents a univalent hydrocarbon radical having 1 to 8 carbon atoms and optionally containing a heteroatom, or an optionally substituted aryl group having 6 to 20 carbon atoms. $R^{L06}$ represents a univalent hydrocarbon radical having 1 to 8 carbon atoms and optionally containing a heteroatom, or an optionally substituted aryl group having 6 to 20 carbon atoms. $R^{L07}$ to $R^{L16}$ each independently represents a hydrogen atom or a univalent hydrocarbon radical having 1 to 15 carbon atoms and optionally containing a heteroatom. $R^{L07}$ to $R^{L16}$ may be joined together to form a ring. In such a case, each of them represents a divalent hydrocarbon radical having 1 to 15 carbon atoms and optionally containing a heteroatom. Alternatively, $R^{L07}$ to $R^{L16}$ may be joined together in such a way that two groups attached to adjacent carbon atoms are directly connected to form a double bond. y is an integer of 0 to 6. m is 0 or 1, and n is 0, 1, 2 or 3. These numbers satisfy the condition defined by 2m+n=2 or 3.

Specific examples of the respective groups are the same as described previously.

The above-described dissolution controllers are used in an amount of 0 to 50 parts by weight, preferably 0 to 40 parts by weight, and more preferably 0 to 30 parts by weight, per 100 parts by weight of the base resin. These dissolution controllers may be used alone or in admixture of two or more. If their amount used is greater than 50 parts by weight, the 4 resulting resist material may show a decrease in the film thickness of patterns, resulting in a reduction in resolving power.

The above-described dissolution controllers may be synthesized by introducing an acid-labile group into a compound having phenolic hydroxyl groups or a carboxyl group according to an organic chemical technique.

Furthermore, basic compounds may be incorporated in the resist materials of the present invention.

As the basic compounds, it is suitable to use compounds capable of suppressing the diffusion rate at which the acid produced by the acid generator diffuses into the resist film. Owing to the incorporation of such a basic compound, the diffusion rate of the acid in the resist film is suppressed to cause an improvement in resolution. Thus, a change in the sensitivity of the resist film after exposure is suppressed and its dependence on the substrate and the environment is minimized, so that an improvement in exposure latitude and pattern profile can be achieved.

Useful basic compounds include primary, secondary and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives and the like.

Specific examples of the primary aliphatic amines include ammonia, methylamine, ethylamine, n-propylamine, isopropyl-amine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylene-diamine, ethylenediamine and tetraethylenepentamine.

Specific examples of the secondary aliphatic amines include dimethylamine, diethylamine, di-n-propylamine, -diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethyl-methylenediamine, N,N-dimethylethylenediamine and N,N-dimethyltetraethylenepentamine.

Specific examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N', N'-tetramethylmethylenediamine, N,N,N',N'-tetramethylethylenediamine and N,N,N',N'-tetramethyltetraethylenepentamine.

Specific examples of the mixed amines include dimethylethylamine, methylethylpropylamine, benzylamine, phenethylamine and benzyldimethylamine.

Specific examples of the aromatic amines and the heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine), diphenyl(p-tolyl)amine, methyldiphenyl-amine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole and N-methylpyrrole), oxazole derivatives (e.g., oxazole and isoxazole), thiazole derivatives (e.g., thiazole and isothiazole), imidazole derivatives (e.g., imidazole, 4-methylimidazole and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butyl-pyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinoline-carbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives.

Specific examples of the nitrogen-containing compounds having a carboxyl group include aminobenzoic acid, indolecarboxylic acid and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid and methoxyalanine)

Specific examples of the nitrogen-containing compounds having a sulfonyl group include 3-pyridinesulfonic acid and pyridinium p-toluenesulfonate.

Specific examples of the nitrogen-containing compounds having a hydroxyl group, the nitrogen-containing compounds having a hydroxyphenyl group, and the alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,21-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine-ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxy-julolidine, 3-quinuclidinol, 3-tropanol, 1-methyl-2-pyrrolidine-ethanol, 1-aziridine-ethanol, N-(2-hydroxyethyl)-phthalimide and N-(2-hydroxyethyl)isonicotinamide. Specific examples of the amide derivatives include formamide, N-methylformamide, N,N-dimethylformamide, acetamide, N-methylacetamide, N,N-dimethylacetamide, propionamide and benzamide. Specific examples of the imide derivatives include phthalimide, succinimide and maleimide.

Furthermore, one or more basic compounds may be selected from those represented by the following general formula (B1) and incorporated in the resist materials of the present invention.

$$N(X)_n(Y)_{3-n} \qquad \mathrm{B1}$$

wherein n is 1, 2 or 3; each Y independently represents a hydrogen atom or a straight-chain, branched or cyclic alkyl group having 1 to 20 carbon atoms, and may contain a hydroxyl group or an ether linkage; and each X independently represents one of the groups represented by the following general formulas (X1) to (X3), and two or three X groups may be joined together to form a ring.

X1

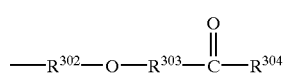
X2

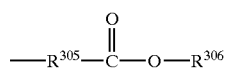
X3 wherein $R^{300}$, $R^{302}$ and $R^{305}$ each represents a straight-chain or branched alkylene group having 1 to 4 carbon atoms; $R^{301}$ and $R^{304}$ each represents a hydrogen atom or a straight-chain, branched or cyclic alkyl group having 1 to 20 carbon atoms, and may contain one or more hydroxy groups, ether linkages, ester linkages or lactone rings; and $R^{303}$ represents a single bond or a straight-chain or branched alkylene group having 1 to 4 carbon atoms. Specific examples of the compounds represented by the general formula (B1) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)-ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl) amine, N,N-bis(2-acetoxyethyl)-2-(acetoxyacetoxy) ethylamine, tris(2-methoxycarbonyloxyethyl)amine, tris(2-tert-butoxycarbonyloxy-ethyl)amine, tris[2-(2-oxopropoxy)ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonyl-ethyl) amine, tris(2-ethoxycarbonylethyl) amine, N,N-bis (2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2- (2-hydroxyethoxycarbonyl) ethylamine, N,N-bis(2-acetoxyethyl)-2-(2-acetoxyethoxycarbonyl)ethylamine, N,N-bis (2-hydroxyethyl)-2-[(methoxycarbonyl)methoxycarbonyl ]-ethylamine, N,N-bis(2-acetoxyethyl)-2-[(methoxycarbonyl)-methoxycarbonyl] ethylamine, N,N-bis(2-hydroxyethyl)-2-(2-oxopropoxycarbonyl) ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl) ethylamine, N,N-bis(2-hydroxyethyl)-2-[(2-oxotetrahydrofuran-3-yl)-oxycarbonyl]ethylamine, N,N-bis (2-acetoxyethyl)-2-[(2-oxotetrahydrofuran-3-yl) oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl) ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(ethoxycarbonyl)ethyl]amine, N-(2-acetoxyethyl)bis[2-(ethoxycarbonyl)ethyl]amine, N-(2-hydroxy-1-propyl)bis[2-(methoxycarbonyl)ethyl]amine, N-(3-acetoxy-1-propyl)bis[2-(methoxycarbonyl)ethyl] amine, N-(2-methoxyethyl)bis [2- (methoxycarbonyl)ethyl] amine, N-butylbis[2-(methoxycarbonyl)ethyl]amine, N-butylbis[2-(2-methoxyethoxy-carbonyl)ethyl]amine, N-methylbis(2-acetoxyethyl)amine, N-ethylbis(2-acetoxyethyl)amine, N-methylbis(2-pivaloyloxy-ethyl) amine, N-ethylbis[2-(methoxycarbonyloxy)ethyl]amine, N-ethylbis[2-(tert-butoxycarbonyloxy)ethyl]amine, tris (methoxy-carbonylmethyl)amine, tris (ethoxycarbonylmethyl)amine, N-butylbis (methoxycarbonylmethyl)amine, N-hexylbis(methoxy-carbonylmethyl)amine and β-(diethylamino)-δ-valerolactone.

Furthermore, one or more basic compounds having a cyclic structure may be selected from those represented by the following general formula (B2) and incorporated in the resist materials of the present invention.

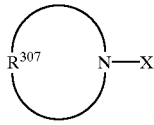
B2 wherein X is as defined above; and $R^{307}$ represents a straight-chain or branched alkylene group having 2 to 20 carbon atoms, and may contain one or more carbonyl groups, ether linkages, ester linkages or sulfide linkages.

Specific examples of the basic compounds having a cyclic structure as represented by the above general formula (B2) include 1-[2-(methoxymethoxy)ethyl]pyrrolidine, 1-[2-(methoxymethoxy)ethyl]piperidine, 4-[2-(methoxymethoxy)-ethyl]morpholine, 1-[2-[(2-methoxyethoxy)methoxy)ethyl]-pyrrolidine, 1-[2-[(2-methoxyethoxy)methoxy)ethyl]piperidine, 4-[2-[(2-methoxyethoxy)methoxy)ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxy-carbonyloxy)ethyl]morpholine, 1-[2-(t-butoxycarbonyloxy)ethyl]piperidine, 4-[2-(2-methoxyethoxycarbonyloxy)-ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)-propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl-propionate, butyl 3-morpholinopropionate, cyclohexyl 3-piperidinopropionate, α-(1-pyrrolidinyl) methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate and 2-methoxyethyl morpholinoacetate.

Furthermore, one or more basic compounds having a cyano group may be selected from those represented by the following general formulas (B3) to (B6) and incorporated in the resist materials of the present invention.

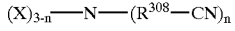
B3

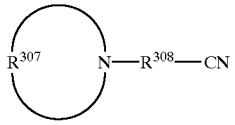
B4

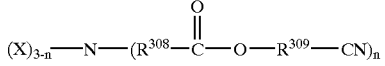
B5

-continued

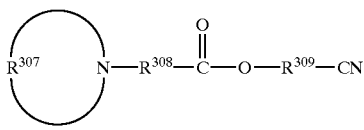

wherein X, $R^{307}$ and n are as defined above; and $R^{308}$ and $R^{309}$ each independently represents a straight-chain or branched alkylene group having 1 to 4 carbon atoms.

Specific examples of the basic compounds having a cyano group as represented by the above general formulas (B3) and (B6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-amino-propiononitrile, N,N-bis(2-methoxyethyl)-3-aminopropiono-nitrile, N,N-bis[2-(methoxymethoxy)ethyl]-3-aminopropiono-nitrile, methyl N-(2-cyanoethyl)-N-(2-methoxyethyl)-3-amino-propionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiono-nitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-amino-propiononitrile, N-(2-cyanoethyl)-N-(2-methoxyethyl)-3-aminopropiononitrile, N-(2-cyanoethyl)-N-[2-(methoxymethoxy)-ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxy-ethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyano-methyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxy-ethyl)aminoacetonitrile, N-cyanomethyl-N-(2-methoxyethyl)-aminoacetonitrile, N-cyanomethyl-N-[2-(methoxymethoxy)ethyl]-aminoacetonitrile, N-(cyanomethyl)-N-(3-hydroxy-1-propyl)-aminoacetonitrile, N-(3-acetoxy-1-propyl)-N-(cyanomethyl)-aminoacetonitrile, N-cyanomethyl-N-(3-formyloxy-1-propyl)-aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate and 2-cyanoethyl 4-morpholinepropionate.

The above-described basic compounds are added in an amount of 0.001 to 10 parts by weight and preferably 0.01 to 1 part by weight, per part by weight of the acid generator. If their amount added is less than 0.001 part by weight, these additives may fail to produce a sufficient effect, and if it is greater then 10 parts by weight, they may cause a reduction in resolving power or sensitivity.

Furthermore, compounds having a group of the formula ≡—C—COOH in the molecule may also be incorporated in the resist materials of the present invention.

As the compounds having a group of the formula ≡C—COOH in the molecule, there may be used, for example, one or more compounds selected from the following Classes I and II. However, it is to be understood that the present invention is not limited thereto. The incorporation of this ingredient enhances the PED stability of the resist and improves its Lit edge roughness on a nitride substrate.

[Class I]

Compounds represented by the following general formulas (A1) to (A10), in which the hydrogen atoms in phenolic hydroxyl groups are partially or completely replaced by —$R^{401}$—COOH (in which $R^{401}$ represents a straight-chain or branched alkylene group having 1 to 10 carbon atoms) and the molar ratio [C/(C+D)] of the phenolic hydroxyl group (C) to the group of the formula ≡C—COOH (D) is in the range of -0.1 to 1.0.

[Class II]

Compounds represented by the following general formulas (A11) to (A15).

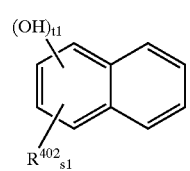

A1

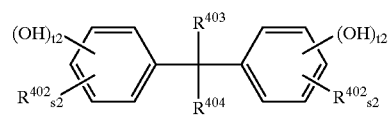

A2

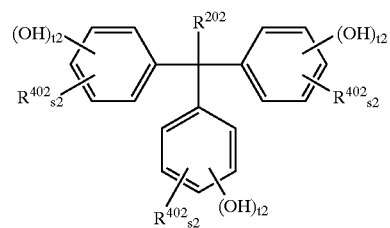

A3

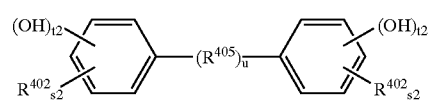

A4

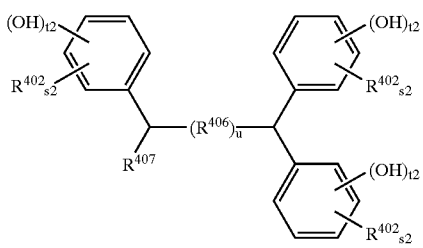
A5

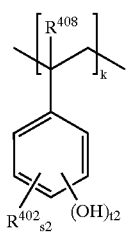
A6

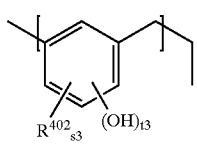
A7

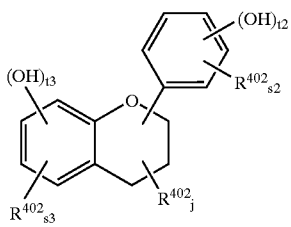
A8

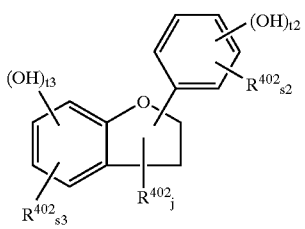
A9

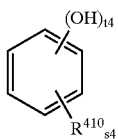
A10 wherein $R^{408}$ represents a hydrogen atom or a methyl group; $R^{402}$ and $R^{403}$ each represents a hydrogen atom or a straight-chain or branched alkyl or alkenyl group having 1 to 8 carbon atoms; $R^{404}$ represents a hydrogen atom, a straight-chain or branched alkyl or alkenyl group having 1 to 8 carbon atoms, or a group of the formula —$(R^{409})_h$—COOR' (in which $R^{409}$ represents a hydrogen atom or —$R^{409}$—COOH); $R^{405}$ represents —$(CH_2)_i$— (in which i is an integer of 2 to 10), an arylene group having 6 to 10 carbon atoms, a carbonyl group, a sulfonyl group, an oxygen atom or a sulfur atom; $R^{406}$ represents an alkylene group having 1 to 10 carbon atoms, an arylene group having 6 to 10 carbon atoms, a carbonyl group, a sulfonyl group, an oxygen atom or a sulfur atom; $R^{407}$ represents a hydrogen atom, a straight-chain or branched alkyl or alkenyl group having 1 to 8 carbon atoms, or a hydroxyl-substituted phenyl or naphthyl group; $R^{409}$ represents a straight-chain or branched alkylene group having 1 to 10 carbon atoms; $R^{410}$ represents a hydrogen atom, a straight-chain or branched alkyl or alkenyl group having 1 to 8 carbon atoms, or a group of the formula —$R^{41}$—COOH; $R^{411}$ represents a straight-chain or branched alkylene group having 1 to 10 carbon atoms; j is an integer of 0 to 5; u and h are each 0 or 1; s1, t1, s2, t2, s3, t3, s4 and t4 are numbers which satisfy the conditions defined by s1+t1=8, s2+t2=5, s3+t3=4, and s4+t4=6, and which cause at least one hydroxyl group to be present in each phenyl skeleton; κ is a number which causes the compound of formula (A6) to have a weight-average molecular weight of 1,000 to 5,000 as measured on a polystyrene basis by GPC; and A is a number which causes the compound of formula (A6) to have a weight-average molecular weight of 1,000 to 10,000 as measured on a polystyrene basis by GPC.

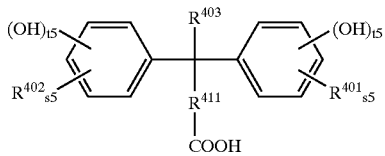
A11

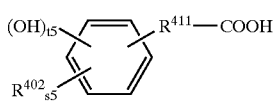
A12

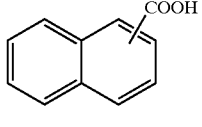
A13

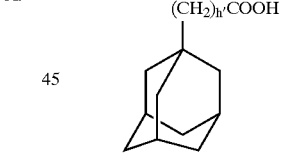
A14

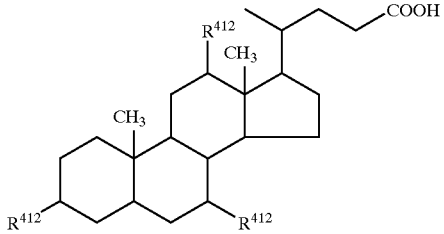
A15

Wherein $R^{402}$, $R^{403}$ and $R^{411}$ are as defined above; $R^{412}$ represents a hydrogen atom or a hydroxyl group; s5 and t5 are numbers which satisfy the conditions defined by s5≧0, t5≧0, and s5+t5=5; and h' is 0 or 1.

Specific examples of this ingredient include compounds represented by the following general formulas AI-1 to AI-14 and AII-1 to AII-10. However, it is to be understood that the present invention is not limited thereto.

AI-1
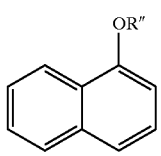
AI-2
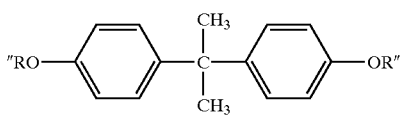
AI-3
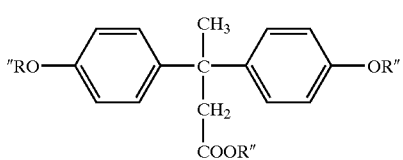
AI-4
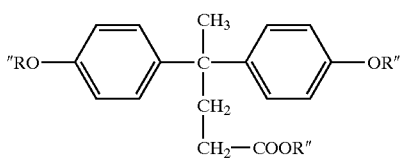
AI-5
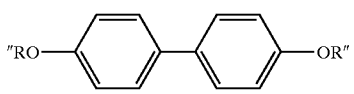
AI-6
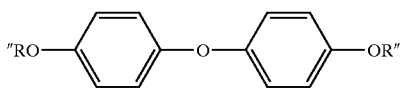
AI-7
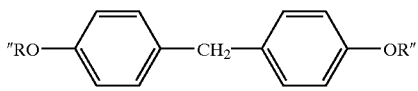
AI-8
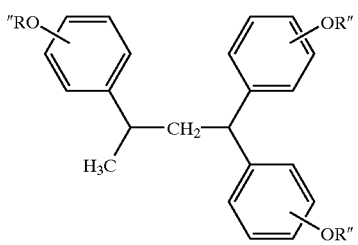
AI-9
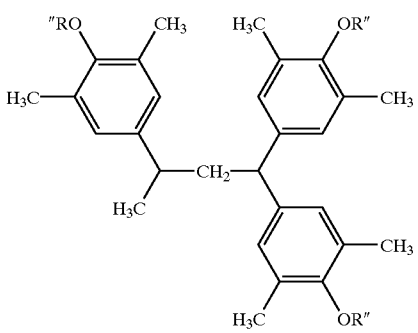
AI-10
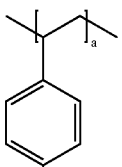
AI-11
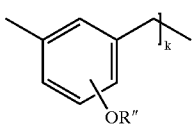
AI-12
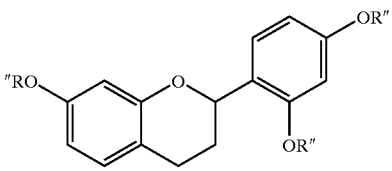
AI-13
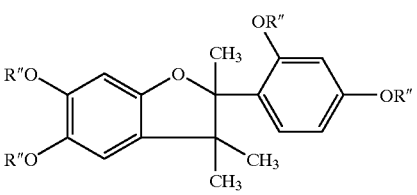
AI-14
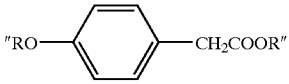
wherein $R^{1\prime}$ represents a hydrogen atom or $CH_2COOH$, and 10 to 100% of R″ in each compound is $CH_2COOH$; and α and κ are as defined above.
AII-1
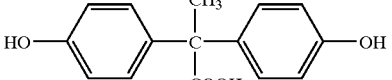
AII-2
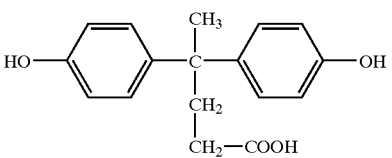
AII-3
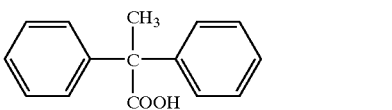
AII-4
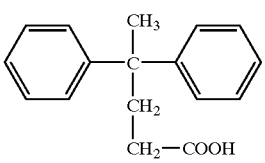
AII-5
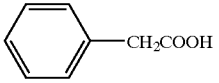

-continued

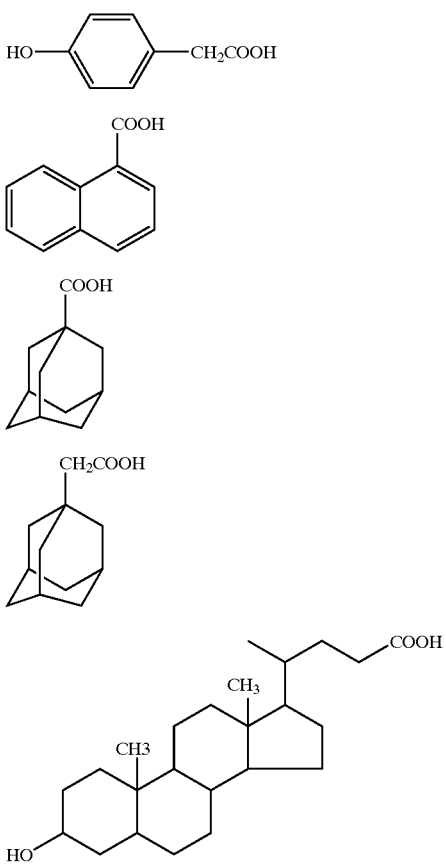

The above-described compounds having a group of the formula ≡—C—COOH in the molecule may be used alone or in admixture of two or more.

The above-described compounds having a group of the formula ≡—C—COOH in the molecule are added in an amount of 0 to 5 parts by weight, preferably 0.1 to 5 parts by weight, more preferably 0.1 to 3 parts by weight, and still more preferably 0.1 to 2 parts by weight, per 100 parts by weight of the base resin. If their amount added is greater than 5 parts by weight, the resulting resist material may show a reduction in resolving power.

Furthermore, additives comprising acetylene alcohol derivatives may be incorporated in the resist materials of the present invention. These additives serve to enhance shelf stability.

As the acetylene alcohol derivatives, there may preferably be used compounds represented by the following formulas (S1) and (S2).

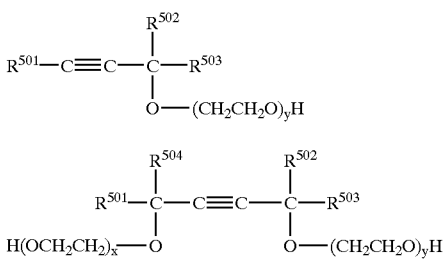

wherein $R^{501}$, $R^{502}$, $R^{503}$, $R^{504}$ and $R^{505}$ each represents a hydrogen atom or a straight-chain, branched or cyclic alkyl group having 1 to 8 carbon atoms; and X and Y each represents 0 or a positive number, and satisfy the conditions defined by $0 \leq X \leq 30$, $0 \leq Y \leq 30$, and $0 \leq X+Y \leq 40$.

Preferred examples of the acetylene alcohol derivatives include Surfinol 61, Surfinol 82, Surfinol 104, Surfinol 104E, Surfinol 104H, Surfinol 104A, Surfinol TG, Surfinol PC, Surfinol 440, Surfinol 465, Surfinol 485 (manufactured by Air Products and Chemicals Inc.) and Surfinol E1004 (manufactured by Nissin Chemical Industry Co., Ltd.).

The above-described acetylene alcohol derivatives are added in an amount of 0.01 to 2% by weight and preferably 0.02 to 1% by weight, based on the total weight of the resist composition. If their amount added is less than 0.01% by weight, the resulting resist material may not show a sufficient improvement in application properties and shelf stability, and if it is greater than 2% by weight, the resulting resist material may show a reduction in resolving power.

Besides the above described ingredients, surface-active agents commonly used to improve application properties may be added as optional ingredients to the resist materials of the present invention. These optional ingredients may be added in conventionally used amounts, so long as they do not interfere the effects of the present invention.

For this purpose, nonionic surface-active agents such as perfluoroalkyl polyoxyethylene ethanol, fluorinated alkyl esters, perfluoroalkylamine oxide, perfluoroalkyl EO adducts and fluorine-containing organosiloxane compounds are preferably used. Specific examples thereof include Florad FC-430 and FC-431 (manufactured by Sumitomo 3M Limited), Surflon S-141, S-145, KH-10, KH-20, KH-30 and KH-40 (manufactured by Asahi Glass Co., Ltd.), Unidain DS-401, DS-403 and DS-451 (manufactured by Daikin Industries, Ltd.), Megafac F-8151 (manufactured by Dainippon Ink & Chemicals, Inc.), and X-70-092 and X-70-093 (manufactured by Shin-etsu Chemical Co., Ltd.). Among others, Florad FC-430 (manufactured by Sumitomo 3M Limited), KH-20 and KH-30 (manufactured by Asahi Glass Co., Ltd.), and X-70-093 (manufactured by Shin-Etsu Chemical Co., Ltd.) are preferred.

The formation of a pattern by using a resist material in accordance with the present invention can be carried out according to a well-known lithographic technique. For example, according to a technique such as spin coating, the resist material is applied to a substrate (e.g., a silicon wafer) so as to give a film thickness of 0.2 to 2.0 μm. This resist film is prebaked on a hot plate at 60–150° C. for 1–10 minutes and preferably at 80–130° C. for 1–5 minutes. Then, while a mask for forming a desired pattern is placed over the aforesaid resist film, high-energy radiation (e.g., far ultraviolet radiation, excimer laser light or X-radiation) or electron rays are applied thereto in an exposure of about 1 to 200 mJ/cm² and preferably about 5 to 100 mJ/cm². Thereafter, the resist film is subjected to a post-exposure bake (PEB) on a hot plate at 60–150° C. for 1–5 minutes and preferably at 80–130° C. for 1–3 minutes. Thereafter, using a developer comprising an aqueous alkaline solution of tetramethylammonium hydroxide (TMAH) or the like having a concentration of 0.1-to 5% and preferably 2 to 3%, the resist film is developed for 0.1 to 3 minutes and preferably 0.5 to 2 minutes according to a conventional process such as a dip process, puddle process or spray process. Thus, the desired pattern is formed on the substrate. The resist materials of the present invention is especially suitable for fine patterning with far ultraviolet radiation or excimer laser light having a wavelength of 248 to 193 nm, X-radiation and electron rays, among various types of high-energy radiation. If the processing conditions go beyond the upper and lower limits of the aforesaid respective ranges, the desired pattern may not be formed.

The present invention is more specifically explained with reference to the following synthesis examples and examples. However, these examples are not to be construed to limit the scope of the invention.

SYNTHESIS EXAMPLES

Several polymers in accordance with the present invention were synthesized according to the formulations described below.

Synthesis Example 1

Synthesis of Polymer 1

37.2 g of 7-oxabicyclo[2.2.1]-2-heptylmethyl 5-norbornene-2-carboxylate (synthesized by reducing (by hydrogenation) the Diels-Alder reaction product of furan with methyl acrylate to form 7-oxabicyclo[2.2.1]heptane-2-methanol and esterifying it with 5-norbornene-2-carboxylic acid), 91.0 g of 2-ethyl-2-norbornyl 5-norbornene-2-carboxylate, and 49.0 g of maleic anhydride were dissolved in 150 ml of tetrahydrofuran, and 1.8 g of 2,2'-azobisisobutyronitrile was added thereto. The resulting mixture was stirred at 60° C. for 15 hours and then concentrated under reduced pressure. The resulting residue was dissolved in 400 ml of tetrahydrofuran, and this solution was added dropwise to 10 L of n-hexane. The solid matter so formed was separated by filtration, washed with 10 L of n-hexane, and vacuum-dried at 40° C. for 6 hours to obtain 89.5 g of a polymer represented by the following formula (Polymer 1). Its yield was 50.5%. Mw is a weight-average molecular weight as measured on a polystyrene basis by GPC.

The $^1$H-NMR and FT-IR data of 7-oxabicyclo[2.2.1]-2-heptylmethyl 5-norbornene-2-carboxylate used as the monomer are given below.

$^1$H-NMR (CDCl$_3$, 270 MHz): .=0.90–2.96 (m,13H), 2.98–3.22 (m,1H), 3.68–4.26 (m,2H), 4.34–4.58 (m,2H), 5.86–6.20 (m,2H)

FT-IR: 1732 cm$^{-1}$

Synthesis Examples 2–12

Synthesis of Polymers 2–12

Polymers 2–12 were synthesized in substantially the same manner as described above or according to well-known formulations.

(Polymer 1)

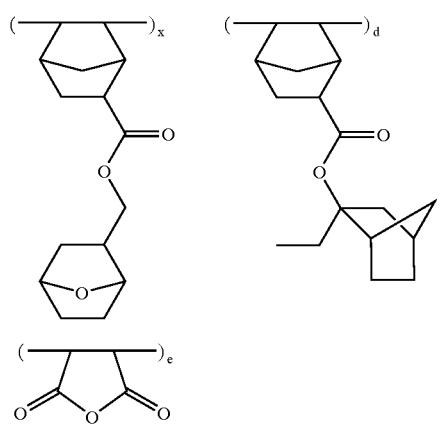

(x = 0.15, d = 0.35, e = 0.50, Mw = 7,300)

(Polymer 2)

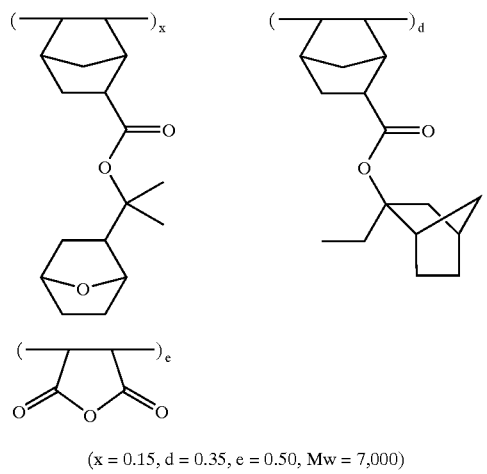

(x = 0.15, d = 0.35, e = 0.50, Mw = 7,000)

(Polymer 3)

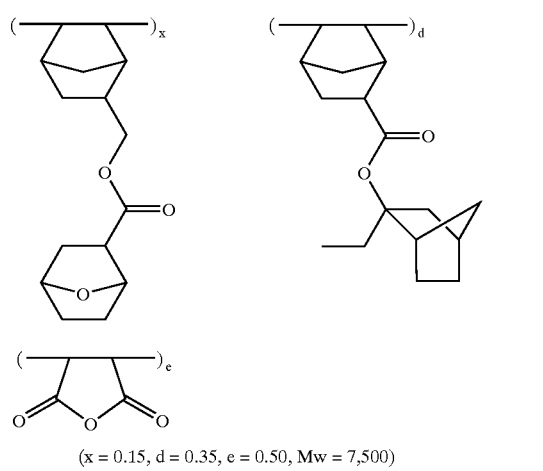

(x = 0.15, d = 0.35, e = 0.50, Mw = 7,500)

(Polymer 4)

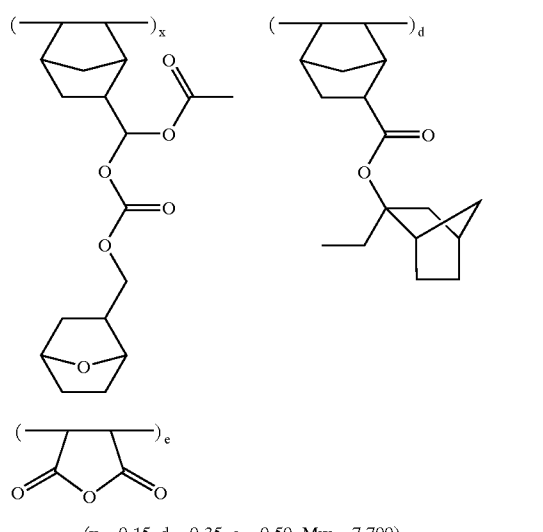

(x = 0.15, d = 0.35, e = 0.50, Mw = 7,700)

(Polymer 5)
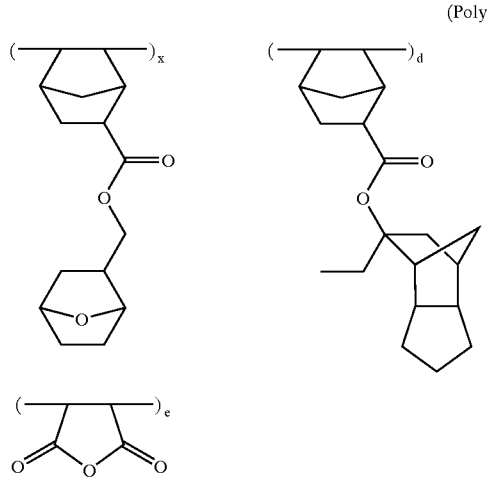
(x = 0.15, d = 0.35, e = 0.50, Mw = 7,800)
(Polymer 6)
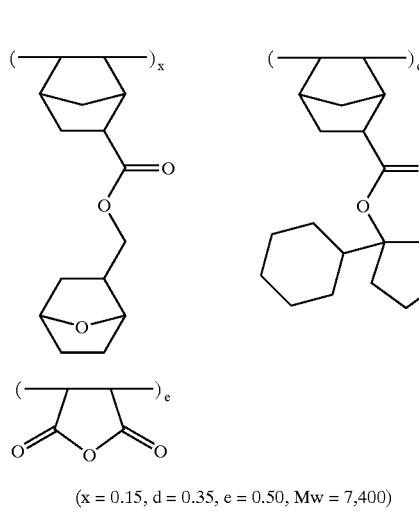
(x = 0.15, d = 0.35, e = 0.50, Mw = 7,400)
(Polymer 7)
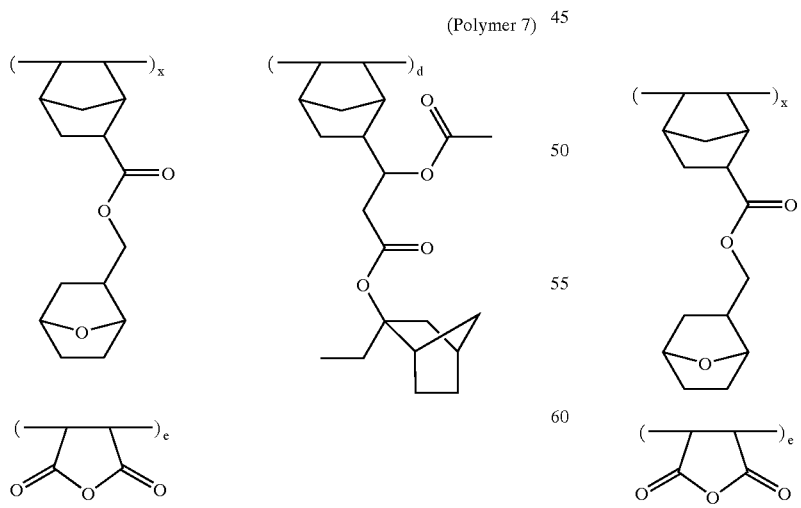
(x = 0.15, d = 0.35, e = 0.50, Mw = 8,100)
(Polymer 8)
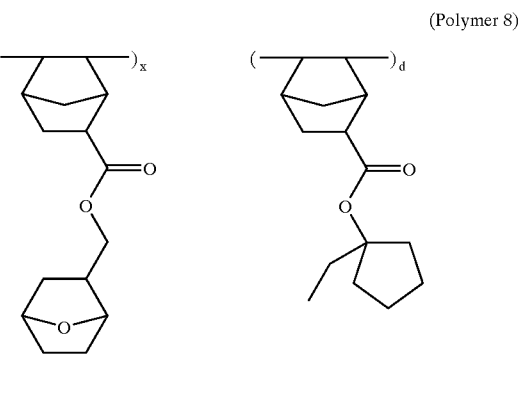
(x = 0.50, d = 0.50, Mw = 19,900)
(Polymer 9)
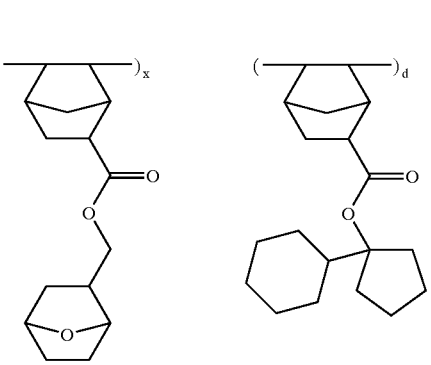
(x = 0.50, d = 0.50, Mw = 18,200)
(Polymer 10)
(x = 0.25, d = 0.50, e = 0.25, Mw = 10,100)

(Polymer 11)

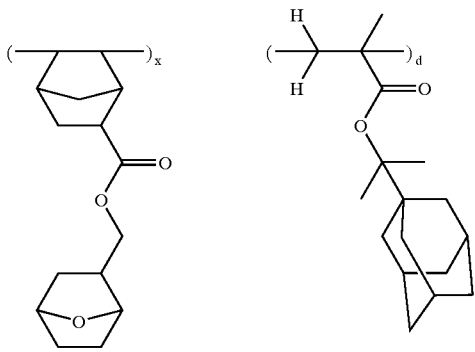

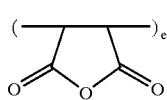

(x = 0.25, d = 0.50, e = 0.25, Mw = 11,500)

(Polymer 12)

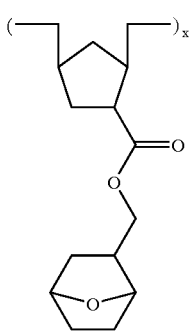

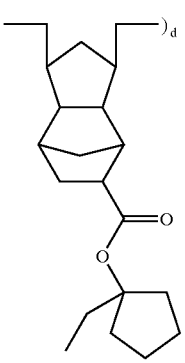

(x = 0.50, d = 0.50, Mw = 13,000)

Example I (Polymer 13)

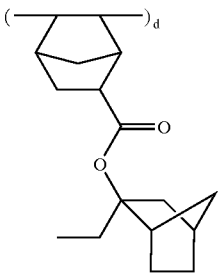

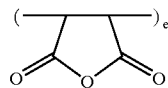

(d = 0.50, e = 0.50, Mw = 8,800)

(Polymer 14)

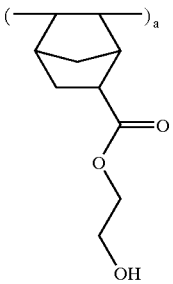

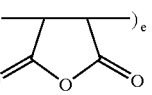

(a = 0.20, d = 0.30, e = 0.50, Mw = 9,700)

(PAG 1)

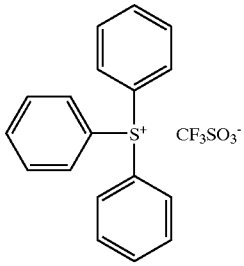

Resist materials were prepared by using several polymer in accordance with the present invention as base resins, and their adhesion to the substrate was evaluated.

Examples I-1 to I-4 and Comparative Examples I-1 and I-2

Several polymers represented by the above formulas (Polymers 1 to 4) and comparative polymers represented by the following formulas (Polymers 13 and 14) were used as base resins. According to the formulations shown in Table 1, these base resins were mixed with an acid generator represented by the following formula (PAG1), a basic compound Y and a solvent. The resulting mixtures were filtered through a Teflon filter (with a pore diameter of 0.2 mm) and used as resist materials.

After a silicon wafer was sprayed with hexamethyldisilazane at 90° C. for 40 seconds, each resist material was spin-coated onto the silicon wafer and then heat-treated at 110° C. for 90 seconds to form a resist film having a thickness of 0.5 μm. This silicon wafer was exposed to light by means of a KrF excimer laser stepper (manufactured by Nikon Corp.; NA=0.5), heat-treated at 110° C. for 90 seconds, and then developed for 60 seconds according to a puddle process using a 2.38% aqueous solution of tetramethylammonium hydroxide. Thus, 1:1 line-and-space patterns were formed. When the developed wafer was observed by overhead SEM (scanning electron microscopy), the minimum line width (μm) which did not peel off but remained on the wafer was regarded as the adhesion limit of the resist material being evaluated.

The composition of each resist material and the results of evaluation are shown in Table 1. In Table 1, the solvent and the basic compound were as follows. In all cases, the solvent contained 0.01% by weight of KH-20 (manufactured by Asahi Glass Co., Ltd.).

PGMEA: Propylene glycol methyl ether acetate.
TBA: Tributylamine.

It has been confirmed by the results shown in Table 1 that the polymers of the present invention have excellent adhesion to the substrate.

TABLE 1

|      |      | Resin (parts by weight) | Acid generator (parts by weight) | Dissolution controller (parts by weight) | Basic compoud (parts by weight) | Solvent (parts by weight) | Adhesion limit ($\mu$m) |
|------|------|------|------|------|------|------|------|
| Ex.  | I-1  | Polymer 1 (80) | PAG 1 (1) | — | TBA (0.078) | PGMEA (480) | 0.26 |
|      | I-2  | Polymer 2 (80) | PAG 1 (1) | — | TBA (0.078) | PGMEA (480) | 0.28 |
|      | I-3  | Polymer 3 (80) | PAG 1 (1) | — | TBA (0.078) | PGMEA (480) | 0.24 |
|      | I-4  | Polymer 4 (80) | PAG 1 (1) | — | TBA (0.078) | PGMEA (480) | 0.24 |
| Comp. Ex. | I-1 | Polymer 13 (80) | PAG 1 (1) | — | TBA (0.078) | PGMEA (480) | >0.50 |
|      | I-2  | Polymer 14 (80) | PAG 1 (1) | — | TBA (0.078) | PGMEA (480) | >0.50 |

Example II

Resist materials were prepared by using several polymers in accordance with the present invention as base resins, and their swell-reducing effect was evaluated.

Examples II-1 to II-4 and Comparative Examples II-1 and II-2

According to the formulations shown in Table 2, resist materials were prepared in the same manner as described above.

After a silicon wafer was sprayed with hexamethyldisilazane at 90° C. for 90 seconds, each resist material was spin-coated onto the silicon wafer and then heat-treated at 110° C. for 90 seconds to form a resist film having a thickness of 0.5 $\mu$m. Using a KrF excimer laser stepper (manufactured by Nikon Corp.; NA=0.5), this silicon wafer was exposed to light at a total of 11 points where 11 different levels of exposure were used (i.e., they included the middle point determined by a separately measured sensitivity (Eth, mJ/cm$^2$), five points whose exposure was increased from the middle point by 5% increments, and five points whose exposure was decreased from the middle point by 5% increments), and heat-treated at 110° C. for 90 seconds. Then, the film thickness at each exposed point was measured and defined as the film thickness (A) before development. Thereafter, this silicon wafer was developed by soaking it in a 2.38% aqueous solution of tetramethylammonium hydroxide for 200 seconds. Then, the film thickness at each exposed point was measured again and defined as the film thickness (Å) after development. The film thickness after development and the film thickness after development were compared with respect to each exposed point, and it was considered that swelling occurred at a point where the film thickness increased after development. The maximum increase in film thickness was regarded as the amount of swell (Å).

The composition of each resist material and the results of evaluation are shown in Table 2. In Table 2, the solvent and the basic compound were as follows. In all cases, the solvent contained 0.01% by weight of KH-20 (manufactured by Asahi Glass Co., Ltd.).

PGMEA: Propylene glycol methyl ether acetate.
TBA: Tributylamine.

It has been confirmed by the results shown in Table 2 that the polymers of the present invention have an excellent swell-reducing effect.

TABLE 2

|      |      | Resin (parts by weight) | Acid generator (parts by weight) | Dissolution controller (parts by weight) | Basic compound (parts by weight) | Solvent (pars by weight) | Amount of swell (Å) |
|------|------|------|------|------|------|------|------|
| Ex.  | II-1 | Polymer 1 (80) | PAG 1 (1) | — | TBA (0.078) | PGMEA (480) | 0 or less |
|      | II-2 | Polymer 2 (80) | PAG 1 (1) | — | TBA (0.078) | PGMEA (480) | 0 or less |
|      | II-3 | Polymer 3 (80) | PAG 1 (1) | — | TBA (0.078) | PGMEA (480) | 0 or less |
|      | II-4 | Polymer 4 (80) | PAG 1 (1) | — | TBA (0.078) | PGMEA (480) | 0 or less |
| Comp. Ex. | II-1 | Polymer 13 (80) | PAG 1 (1) | — | TBA (0.078) | PGMEA (480) | 181 |
|      | II-2 | Polymer 14 (80) | PAG 1 (1) | — | TBA (0.078) | PGMEA (480) | 89 |

Example III

With respect to several resist materials in accordance with the present invention, their resolving power in an exposure process using a KrF excimer laser was evaluated.

Examples III-1 to III-21

Evaluation of Resolving Power of Resist Materials

Several polymers represented by the above formulas (Polymers 1 to 12) were used as base resins. According to the formulations shown in Table 3, these base resins were mixed with acid generators represented by the following formulas (PAG1 and 2), dissolution controllers represented by the following formulas (DRR1 to 4), a basic compound, compounds containing a group of the formula ≡—C—COOH in the molecule and represented by the following formulas (ACC1 and 2), and a solvent. The resulting mixtures were filtered through a Teflon filter (with a pore diameter of 0.2 μm) and used as resist materials.

(PAG 1)
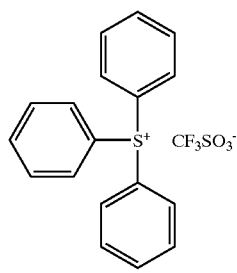

(PAG 2)
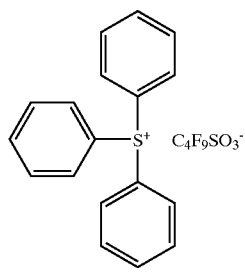

(DRR 1)
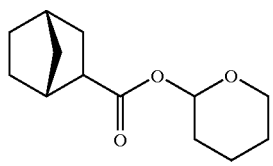

(DRR 2)
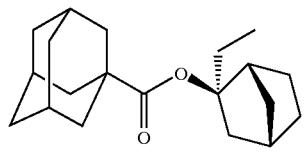

(DRR 3)
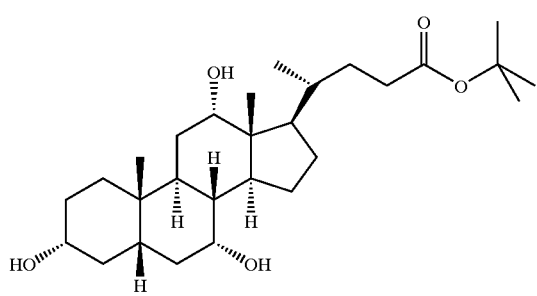

(DRR 4)
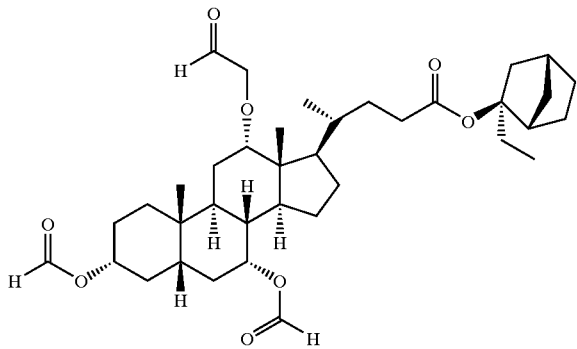

(ACC 1)

(ACC 2)
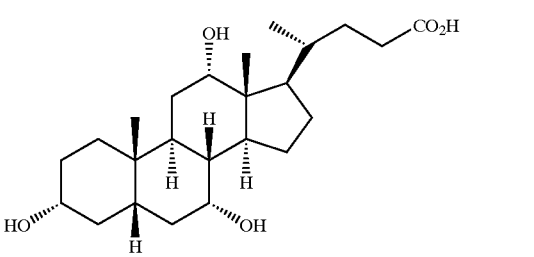

After a silicon wafer was sprayed with hexamethyldisilazane at 90° C. for 90 seconds, each resist material was spin-coated onto the silicon wafer and then heat-treated at 110° C. for 90 seconds to form a resist film having a thickness of 0.5 μm. This silicon wafer was exposed by means of a KrF excimer laser stepper (manufactured by Nikon Corp.; NA=0.5), heat-treated at 110° C. for 90 seconds, and then developed for 60 seconds according to a puddle process using a 2.38% aqueous solution of tetramethylammonium hydroxide. Thus, 1:1 line-and-space patterns were formed. When a cross section of the developed wafer was observed by sectional SEM (scanning electron microscopy), the minimum line width (μm) of line-and-space patterns which were separated at an exposure which can resolve 0.30 μm lines and spaces 1:1 (i.e., the optimum exposure (Eop), mJ/cm$^2$) was regarded as the resolution of the resist material being evaluated. During this observation, the pattern shape was classified into rectangular, round-headed, T-topped, regular tapered or reverse tapered. Eventually, all patterns were rectangular.

The composition of each resist material and the results of evaluation are shown in Table 3. In Table 3, the solvent and the basic compounds were as follows. In all cases, the solvent contained 0.01% by weight of KH-20 (manufactured by Asahi Glass Co., Ltd.).

PGMEA: Propylene glycol methyl ether acetate.
TEA: Triethanolamine.
TMMEA: Trismethoxymethoxyethylamine.
TMEMEA: Trismethoxyethoxymethoxyethylamine.

It has been confirmed by the results shown in Table 3 that the resist materials of the present invention exhibit high sensitivity and high resolving power in an exposure process using a KrF excimer laser.

TABLE 3

| Example | Resin (parts by weight) | Acid generator (parts by weight) | Dissolution controller (parts by weight) | Basic compound (parts by weight) | Solvent (parts by weight) | Optimum exposure (mJ/cm$^2$) | Resolution ($\mu$m) | shape |
|---|---|---|---|---|---|---|---|---|
| III-1 | Polymer 1 (80) | PAG 1 (1) | — | TEA (0.063) | PGMEA (480) | 27.0 | 0.2 | Rectangular |
| III-2 | Polymer 2 (80) | PAG 1 (1) | — | TEA (0.063) | PGMEA (480) | 25.0 | 0.22 | Rectangular |
| III-3 | Polymer 3 (80) | PAG 1 (1) | — | TEA (0.063) | PGMEA (480) | 26.0 | 0.2 | Rectangular |
| III-4 | Polymer 4 (80) | PAG 1 (1) | — | TEA (0.063) | PGMEA (480) | 24.0 | 0.2 | Rectangular |
| III-5 | Polymer 5 (80) | PAG 1 (1) | — | TEA (0.063) | PGMEA (480) | 26.0 | 0.2 | Rectangular |
| III-6 | Polymer 6 (80) | PAG 1 (1) | — | TEA (0.063) | PGMEA (480) | 24.0 | 0.2 | Rectangular |
| III-7 | Polymer 7 (80) | PAG 1 (1) | — | TEA (0.063) | PGMEA (480) | 22.0 | 0.2 | Rectangular |
| III-8 | Polymer 8 (80) | PAG 1 (1) | — | TEA (0.063) | PGMEA (560) | 24.0 | 0.22 | Rectangular |
| III-9 | Polymer 9 (80) | PAG 1 (1) | — | TEA (0.063) | PGMEA (560) | 21.0 | 0.2 | Rectangular |
| III-10 | Polymer 10 (80) | PAG 1 (1) | — | TEA (0.063) | PGMEA (480) | 28.0 | 0.2 | Rectangular |
| III-11 | Polymer 11 (80) | PAG 1 (1) | — | TEA (0.063) | PGMEA (480) | 30.0 | 0.22 | Rectangular |
| III-12 | Polymer 12 (80) | PAG 1 (1) | — | TEA (0.063) | PGMEA (560) | 24.0 | 0.22 | Rectangular |
| III-13 | Polymer 6 (80) | PAG 2 (1) | — | TEA (0.063) | PGMEA (480) | 25.0 | 0.2 | Rectangular |
| III-14 | Polymer 6 (80) | PAG 2 (1) | — | TMMEA (0.118) | PGMEA (480) | 26.0 | 0.2 | Rectangular |
| III-15 | Polymer 6 (80) | PAG 2 (1) | — | TMEMEA (0.173) | PGMEA (480) | 26.0 | 0.22 | Rectangular |
| III-16 | Polymer 1 (70) | PAG 2 (1) | DRR 1 (10) | TEA (0.063) | PGMEA (480) | 22.0 | 0.22 | Rectangular |
| III-17 | Polymer 1 (70) | PAG 2 (1) | DRR 2 (10) | TEA (0.063) | PGMEA (480) | 24.0 | 0.22 | Rectangular |
| III-18 | Polymer 1 (70) | PAG 2 (1) | DRR 3 (10) | TEA (0.063) | PGMEA (480) | 28.0 | 0.22 | Rectangular |
| III-19 | Polymer 1 (70) | PAG 2 (1) | DRR 4 (10) | TEA (0.063) | PGMEA (480) | 25.0 | 0.2 | Rectangular |
| III-20 | Polymer 1 (80) | PAG 2 (1) | ACC 1 (4) | TEA (0.063) | PGMEA (480) | 26.0 | 0.22 | Rectangular |
| III-21 | Polymer 1 (80) | PAG 2 (1) | ACC 2 (4) | TEA (0.063) | PGMEA (480) | 28.0 | 0.22 | Rectangular |

Example IV

With respect to several resist materials in accordance with the present invention, their resolving power in an exposure process using an ArF excimer laser was evaluated.

Examples IV-1 and IV-2

Evaluation of Resolving Power of Resist Materials

According to the formulations shown in Table 4, resist materials were prepared in the same manner as described above.

After a silicon wafer was sprayed with hexamethyldisilazane at 90° C. for 90 seconds, each resist material was spin-coated onto the silicon wafer and then heat-treated at 110° C. for 90 seconds to form a resist film having a thickness of 0.5 $\mu$m. This silicon wafer was exposed by means of an ArF excimer laser stepper (manufactured by Nikon Corp.; NA=0.55), heat-treated at 110° C. for 90 seconds, and then developed for 60 seconds according to a puddle process using a 2.38% aqueous solution of tetramethylammonium hydroxide. Thus, 1:1 line-and-space patterns were formed. When a cross section of the developed wafer was observed by sectional SEM (scanning electron microscopy), the minimum line width ($\mu$m) of line-and-space patterns which were separated at an exposure which can resolve 0.25 $\mu$m lines and spaces 1:1 (i.e., the optimum exposure (Eop),-mJ/cm$^2$) was regarded as the resolution of the resist material being evaluated. During this observation, the pattern shape was classified into rectangular, round-headed, T-topped, regular tapered or reverse tapered. Eventually, all patterns were rectangular.

The composition of each resist material and the results of evaluation are shown in Table 3. In Table 4, the solvent and the basic compounds were as follows. In all cases, the solvent contained 0.01% by weight of KH-20 (manufactured by Asahi Glass Co., Ltd.).

PGMEA: Propylene glycol methyl ether acetate.
TEA: Triethanolamine.
TMMEA: Trismethoxymethoxyethylamine.

It has been confirmed by the results shown in Table 4 that the resist materials of the present invention exhibit high sensitivity and high resolving power in an exposure process using an ArF excimer laser.

TABLE 4

| Example | Resin (parts by weight) | Acid generator (parts by weight) | Dissolution controller (parts by weight) | Basic compound (parts by weight) | Solvent (parts by weight) | Optimum exposure (mJ/cm$^2$) | Resolution ($\mu$m) | Shape |
|---|---|---|---|---|---|---|---|---|
| IV-1 | Polymer 6 (80) | PAG 1 (1) | — | TEA (0.063) | PGMEA (480) | 17.0 | 0.15 | Rectangular |
| IV-2 | Polymer 6 (80) | PAG 2 (1) | — | TMMEA (0.118) | PGMEA (480) | 18.0 | 0.15 | Rectangular |

What is claimed is:

1. A polymer containing repeating units represented by the following general formula (1-1) or (1-2) and having a weight-average molecular weight of 1,000 to 500,000

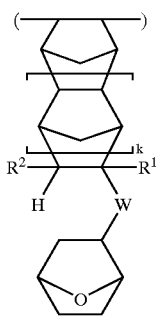

(1-1)

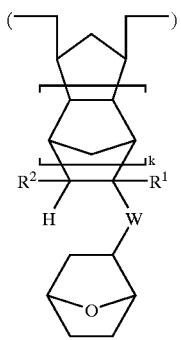

(1-2)

wherein $R^1$ represents a hydrogen atom, a methyl group or $CH_2CO_2R$; $R^2$ represents a hydrogen atom, a methyl group or $CO_2R^3$; $R^3$ represents a straight-chain, branched or cyclic alkyl group having 1 to 15 carbon atoms, and may be common to $R^1$ and $R^2$ or different therebetween; W represents a straight-chain or branched divalent hydrocarbon radical having 2 to 10 carbon atoms, which may have one or more ester linkages in its structure and may further be substituted by one or more other-atomic groups containing a heteroatom; and k is 0 or 1.

2. A polymer as claimed in claim 1 which, in addition to the repeating units represented by the above general formula (1-1), contains repeating units represented by the following general formula (2-1)

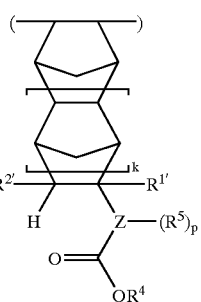

(2-1)

wherein k is as defined in claim 1; $R^{1\prime}$ represents a hydrogen atom, a methyl group or $CH_2CO_2R^{3\prime}$; $R^{2\prime}$ represents a hydrogen atom, a methyl group or $CO_2R^{3\prime}$; $R^{3\prime}$ represents a straight-chain, branched or cyclic alkyl group having 1 to 15 carbon atoms, and may be common to R" and $R^{2\prime}$ or different therebetween; $R^4$ represents an acid-labile group; $R^5$ represents a halogen atom, a hydroxyl group, a straight-chain, branched or cyclic alkoxy, acyloxy or alkylsulfonyloxy group having 1 to 15 carbon atoms, or a straight-chain, branched or cyclic alkoxyalkoxy or alkoxycarbonyloxy group having 2 to 15 carbon atoms, in which the hydrogen atoms on the constituent carbon atoms may be partially or completely replaced by halogen atoms; Z represents a single bond or a straight-chain, branched or cyclic (p+2)-valent hydrocarbon radical having 1 to 5 carbon atoms, and when Z is a hydrocarbon radical, one or more methylene groups may be replaced by an oxygen atom to form a linear or cyclic ether, or two hydrogen atoms on an identical carbon atom may be replaced by an oxygen atom to form a ketone; and p is 0, 1 or 2.

3. A resist material containing a polymer as claimed in claim 2.

4. A pattern formation method comprising the steps of applying the resist material of claim 3 to a substrate; after a heat treatment, exposing the resist material to high-energy radiation or electron rays through a photomask; and, after a heat treatment, developing the resist material with a developer.

5. A resist material as claimed in claim 3, further comprising at least one additional component selected from the group consisting of an acid generator and an organic solvent.

6. A polymer as claimed in claim 1 which, in addition to the repeating units represented by the above general formula (1-1), contains repeating units represented by the following general formulas (2-1) and (3)

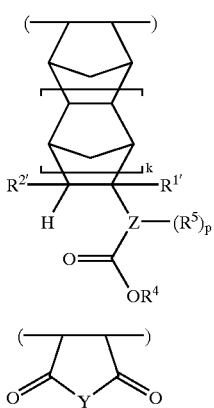

(2-1)

(3)

wherein k is as defined in claim 1; $R^{1\prime}$ represents a hydrogen atom, a methyl group or $CH_2CO_2R^{3\prime}$; $R^{2\prime}$ represents a hydrogen atom, a methyl group or $CO_2R^{3\prime}$; $R^{3\prime}$ represents a straight-chain, branched or cyclic alkyl group having 1 to 15 carbon atoms, and may be common to R″ and $R^{2\prime}$ or different therebetween; $R^4$ represents an acid-labile group; $R^5$ represents a halogen atom, a hydroxyl group, a straight-chain, branched or cyclic alkoxy, acyloxy or alkylsulfonyloxy group having 1 to 15 carbon atoms, or a straight-chain, branched or cyclic alkoxyalkoxy or alkoxycarbonyloxy group having 2 to 15 carbon atoms, in which the hydrogen atoms on the constituent carbon atoms may be partially or completely replaced by halogen atoms; Z represents a single bond or a straight-chain, branched or cyclic (p+2)-valent hydrocarbon radical having 1 to 5 carbon atoms, and when Z is a hydrocarbon radical, one or more methylene groups may be replaced by an oxygen atom to form a linear or cyclic ether, or two hydrogen atoms on an identical carbon atom may be replaced by an oxygen atom to form a ketone; Y represents —O— or —(NR$^6$)—; $R^6$ represents a hydrogen atom or a straight-chain, branched or cyclic alkyl group having 1 to 15 carbon atoms; and p is 0, 1 or 2.

7. A resist material containing a polymer as claimed in claim 6.

8. A pattern formation method comprising the steps of applying the resist material of claim 7 to a substrate; after a heat treatment, exposing the resist material to high-energy radiation or electron rays through a photomask; and, after a heat treatment, developing the resist material with a developer.

9. A resist material as claimed in claim 7, further comprising at least one additional component selected from the group consisting of an acid generator and an organic solvent.

10. A polymer as claimed in claim 1 which, in addition to the repeating units represented by the above general formula (1-1), contains repeating units represented by the following general formula (4), or both repeating units represented by the following general formula (4) and repeating units represented by the following general formula (2-1), and further contains repeating units represented by the following general formula (3)

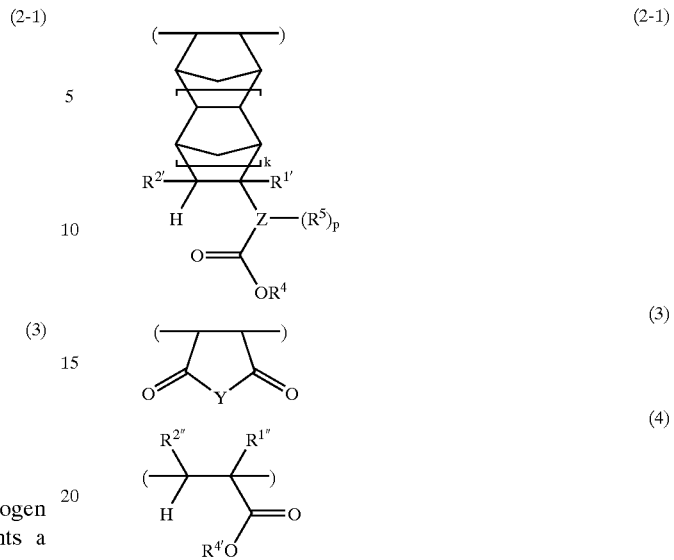

(2-1)

(3)

(4)

wherein k is as defined in claim 1; $R^{1\prime}$ represents a hydrogen atom, a methyl group or $CH_2CO_2R^{3\prime}$; $R^{2\prime}$ represents a hydrogen atom, a methyl group or $CO_2R^{3\prime}$; $R^{3\prime}$ represents a straight-chain, branched or cyclic alkyl group having 1 to 15 carbon atoms, and may be common to $R^{1\prime}$ and $R^{2\prime}$ or different therebetween; $R^{1\prime\prime}$ represents a hydrogen atom, a methyl group or $CH_2CO_2R^{3\prime\prime}$; $R^{2\prime\prime}$ represents a hydrogen atom, a methyl group or $CO_2R^{3\prime\prime}$; $R^{3\prime\prime}$ represents a straight-chain, branched or cyclic alkyl group having 1 to 15 carbon atoms, and may be common to $R^{1\prime\prime}$ and $R^{2\prime\prime}$ or different therebetween; $R^4$ and $R^{4\prime}$ each independently represents an acid-labile group; $R^5$ represents a halogen atom, a hydroxyl group, a straight-chain, branched or cyclic alkoxy, acyloxy or alkylsulfonyloxy group having 1 to 15 carbon atoms, or a straight-chain, branched or cyclic alkoxyalkoxy or alkoxycarbonyloxy group having 2 to 15 carbon atoms, in which the hydrogen atoms on the constituent carbon atoms may be partially or completely replaced by halogen atoms; Z represents a single bond or a straight-chain, branched or cyclic (p+2)-valent hydrocarbon radical having 1 to 5 carbon atoms, and when Z is a hydrocarbon radical, one or more methylene groups may be replaced by an oxygen atom to form a linear or cyclic ether, or two hydrogen atoms on an identical carbon atom may be replaced by an oxygen atom to form a ketone; Y represents —O— or —(NR$^6$)—; R6 represents a hydrogen atom or a straight-chain, branched or cyclic alkyl group having 1 to 15 carbon atoms; and p is 0, 1 or 2.

11. A resist material containing a polymer as claimed in claim 10.

12. A pattern formation method comprising the steps of applying the resist material of claim 11 to a substrate; after a heat treatment, exposing the resist material to high-energy radiation or electron rays through a photomask; and, after a heat treatment, developing the resist material with a developer.

13. A resist material as claimed in claim 11, further comprising at least one additional component selected from the group consisting of an acid generator and an organic solvent.

14. A polymer as claimed in claim 1 which, in addition to the repeating units represented by the above general formula (1-2), contains repeating units represented by the following general formula (2-2)

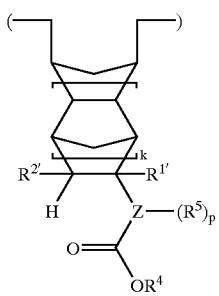

(2-2)

wherein k is as defined in claim 1; R" represents a hydrogen atom, a methyl group or $CH_2CO_2R^{3'}$; $R^{2'}$ represents a hydrogen atom, a methyl group or $CO_2R^{3'}$; $R^{3'}$ represents a straight-chain, branched or cyclic alkyl group having 1 to 15 carbon atoms, and may be common to $R^{1'}$ and $R^2$ or different therebetween; $R^4$ represents an acid-labile group; $R^5$ represents a halogen atom, a hydroxyl group, a straight-chain, branched or cyclic alkoxy, acyloxy or alkylsulfonyloxy group having 1 to 15 carbon atoms, or a straight-chain, branched or cyclic alkoxyalkoxy or alkoxycarbonyloxy group having 2 to 15 carbon atoms, in which the hydrogen atoms on the constituent carbon atoms may be partially or completely replaced by halogen atoms; Z represents a single bond or a straight-chain, branched or cyclic (p+2)-valent hydrocarbon radical having 1 to 5 carbon atoms, and when Z is a hydrocarbon radical, one or more methylene groups may be replaced by an oxygen atom to form a linear or cyclic ether, or two hydrogen atoms on an identical carbon atom may be replaced by an oxygen atom to form a ketone; and p is 0, 1 or 2.

15. A resist material containing a polymer as claimed in claim 14.

16. A pattern formation method comprising the steps of applying the resist material of claim 15 to a substrate; after a heat treatment, exposing the resist material to high-energy radiation or electron rays through a photomask; and, after a heat treatment, developing the resist material with a developer.

17. A resist material as claimed in claim 15, further comprising at least one additional component selected from the group consisting of an acid generator and an organic solvent.

18. A resist material containing a polymer as claimed in claim 1.

19. A pattern formation method comprising the steps of applying the resist material of claim 18 to a substrate; after a heat treatment, exposing the resist material to high-energy radiation or electron rays through a photomask; and, after a heat treatment, developing the resist material with a developer.

20. A resist material as claimed in claim 18, further comprising at least one additional component selected from the group consisting of an acid generator and an organic solvent.

* * * * *